(12) United States Patent
Cao et al.

(10) Patent No.: US 10,312,260 B2
(45) Date of Patent: Jun. 4, 2019

(54) GAN TRANSISTORS WITH POLYSILICON LAYERS USED FOR CREATING ADDITIONAL COMPONENTS

(71) Applicant: Efficient Power Conversion Corporation, El Segundo, CA (US)

(72) Inventors: Jianjun Cao, Torrance, CA (US); Robert Beach, La Crescenta, CA (US); Alexander Lidow, Santa Monica, CA (US); Alana Nakata, Redondo Beach, CA (US); Guangyuan Zhao, Torrance, CA (US); Yanping Ma, Torrance, CA (US); Robert Strittmatter, Tujunga, CA (US); Michael A. de Rooij, Palm Springs, CA (US); Chunhua Zhou, Torrance, CA (US); Seshadri Kolluri, San Jose, CA (US); Fang-Chang Liu, Toufen Township (TW); Ming-Kun Chiang, Hsinchu (TW); Jiali Cao, Torrance, CA (US); Agus Jauhar, Hsinchu (TW)

(73) Assignee: Efficient Power Conversion Corporation, El Segundo, CA (US)

( * ) Notice: Subject to any disclaimer, the term of this patent is extended or adjusted under 35 U.S.C. 154(b) by 61 days.

(21) Appl. No.: 15/655,508

(22) Filed: Jul. 20, 2017

(65) Prior Publication Data
US 2017/0330898 A1    Nov. 16, 2017

Related U.S. Application Data

(62) Division of application No. 14/959,710, filed on Dec. 4, 2015, now Pat. No. 9,837,438, which is a division
(Continued)

(51) Int. Cl.
*H01L 27/12* (2006.01)
*H01L 29/66* (2006.01)
(Continued)

(52) U.S. Cl.
CPC ...... *H01L 27/1207* (2013.01); *H01L 21/7605* (2013.01); *H01L 21/76224* (2013.01);
(Continued)

(58) Field of Classification Search
CPC ............. H01L 27/1207; H01L 27/085; H01L 27/0605; H01L 29/16; H01L 29/04;
(Continued)

(56) References Cited

U.S. PATENT DOCUMENTS 4,902,637 A * 2/1990 Kondou ............... H01L 21/743
148/DIG. 164
5,006,913 A    4/1991 Sugahara
(Continued)

FOREIGN PATENT DOCUMENTS

JP     4-56163 A    2/1992
JP     5-79958 U    10/1993
(Continued)

*Primary Examiner* — Sophia T Nguyen
(74) *Attorney, Agent, or Firm* — Blank Rome LLP

(57) ABSTRACT

A GaN transistor with polysilicon layers for creating additional components for an integrated circuit and a method for manufacturing the same. The GaN device includes an EPI structure and an insulating material disposed over EPI structure. Furthermore, one or more polysilicon layers are disposed in the insulating material with the polysilicon layers having one or more n-type regions and p-type regions. The device further includes metal interconnects disposed on the insulating material and vias disposed in the insulating material layer that connect source and drain metals to the n-type and p-type regions of the polysilicon layer.

17 Claims, 40 Drawing Sheets

Related U.S. Application Data of application No. 14/445,988, filed on Jul. 29, 2014, now Pat. No. 9,214,461.

(60) Provisional application No. 61/859,519, filed on Jul. 29, 2013, provisional application No. 61/978,014, filed on Apr. 10, 2014.

(51) Int. Cl.

| | |
|---|---|
| *H01L 27/085* | (2006.01) |
| *H01L 29/36* | (2006.01) |
| *H01L 21/762* | (2006.01) |
| *H01L 21/76* | (2006.01) |
| *H01L 29/417* | (2006.01) |
| *H01L 29/423* | (2006.01) |
| *H01L 27/06* | (2006.01) |
| *H01L 29/40* | (2006.01) |
| *H01L 29/778* | (2006.01) |
| *H01L 29/20* | (2006.01) |
| *H01L 21/8258* | (2006.01) |
| *H01L 29/04* | (2006.01) |
| *H01L 29/16* | (2006.01) |
| *H01L 21/768* | (2006.01) |
| *H01L 21/763* | (2006.01) |
| *H01L 29/10* | (2006.01) |

(52) U.S. Cl.
CPC ...... *H01L 21/8258* (2013.01); *H01L 27/0605* (2013.01); *H01L 27/085* (2013.01); *H01L 29/04* (2013.01); *H01L 29/16* (2013.01); *H01L 29/2003* (2013.01); *H01L 29/36* (2013.01); *H01L 29/402* (2013.01); *H01L 29/41775* (2013.01); *H01L 29/42372* (2013.01); *H01L 29/66462* (2013.01); *H01L 29/66765* (2013.01); *H01L 29/7786* (2013.01); *H01L 21/763* (2013.01); *H01L 21/76802* (2013.01); *H01L 21/76877* (2013.01); *H01L 29/1066* (2013.01); *H01L 29/41733* (2013.01); *H01L 29/41766* (2013.01); *H01L 29/42356* (2013.01); *H01L 29/42384* (2013.01)

(58) Field of Classification Search
CPC ........... H01L 29/66765; H01L 29/7786; H01L 29/66462; H01L 29/2003; H01L 21/8258; H01L 21/7605
See application file for complete search history.

(56) References Cited

U.S. PATENT DOCUMENTS

| | | | |
|---|---|---|---|
| 5,041,884 A | 8/1991 | Kumamoto | |
| 5,091,762 A | 2/1992 | Watanabe | |
| 5,266,511 A | 11/1993 | Takao | |
| 5,606,186 A | 2/1997 | Noda | |
| 5,675,185 A | 10/1997 | Chen | |
| 5,712,494 A * | 1/1998 | Akiyama | H01L 29/41733 257/294 |
| 5,818,069 A | 10/1998 | Kadosh | |
| 5,844,303 A * | 12/1998 | Kikkawa | H01L 21/02381 257/609 |
| 5,852,310 A * | 12/1998 | Kadosh | H01L 21/8221 257/67 |
| 5,880,991 A | 3/1999 | Hsu | |
| 5,888,872 A | 3/1999 | Gardner | |
| 5,889,302 A | 3/1999 | Liu | |
| 5,903,014 A * | 5/1999 | Ino | G02F 1/13454 257/66 |
| 5,923,067 A | 7/1999 | Voldman | |
| 5,949,092 A | 9/1999 | Kadosh | |
| 5,950,082 A | 9/1999 | Gardner | |
| 5,990,507 A | 11/1999 | Mochizuki | |
| 6,030,860 A * | 2/2000 | Gardner | H01L 21/76895 257/E21.59 |
| 6,075,258 A | 6/2000 | Gardner et al. | |
| 6,075,268 A * | 6/2000 | Gardner | H01L 21/8221 257/327 |
| 6,172,381 B1 | 1/2001 | Gardner | |
| 6,261,875 B1 * | 7/2001 | Zhang | H01L 21/2022 438/149 |
| 6,271,542 B1 | 8/2001 | Emma | |
| 6,429,484 B1 | 8/2002 | Yu | |
| 6,600,173 B2 * | 7/2003 | Tiwari | H01L 21/76254 257/347 |
| 7,115,451 B2 | 10/2006 | Gonzalez | |
| 7,157,305 B2 | 1/2007 | Prall | |
| 7,268,030 B2 | 9/2007 | Bhattacharyya | |
| 7,417,266 B1 | 8/2008 | Cazaux et al. | |
| 7,479,673 B2 | 1/2009 | Jang | |
| 7,723,207 B2 | 5/2010 | Alam et al. | |
| 7,915,164 B2 | 3/2011 | Konevecki | |
| 7,947,540 B2 | 5/2011 | Lee | |
| 7,994,582 B2 | 8/2011 | Park | |
| 7,998,851 B2 | 8/2011 | Son | |
| 7,999,297 B2 | 8/2011 | Yang | |
| 8,470,688 B2 | 6/2013 | Isobe | |
| 8,492,773 B2 | 7/2013 | Hebert | |
| 8,541,819 B1 | 9/2013 | Or-Bach et al. | |
| 8,581,309 B2 | 11/2013 | Yamazaki et al. | |
| 8,587,033 B1 | 11/2013 | Rieger | |
| 8,779,479 B2 | 7/2014 | Yamazaki et al. | |
| 8,896,046 B2 | 11/2014 | Kato | |
| 8,901,559 B2 | 12/2014 | Yamazaki et al. | |
| 8,947,154 B1 | 2/2015 | Shah | |
| 9,087,689 B1 | 7/2015 | Tran | |
| 9,214,461 B2 * | 12/2015 | Cao | H01L 29/66462 |
| 9,837,438 B2 * | 12/2017 | Cao | H01L 29/66462 |
| 2002/0098635 A1 | 7/2002 | Zhang et al. | |
| 2004/0018711 A1 | 1/2004 | Madurawe | |
| 2004/0144979 A1 | 7/2004 | Bhattacharyya | |
| 2004/0185622 A1 | 9/2004 | Williams et al. | |
| 2005/0073051 A1 | 4/2005 | Yamamoto | |
| 2006/0049409 A1 | 3/2006 | Rafferty | |
| 2006/0057793 A1 | 3/2006 | Hatori et al. | |
| 2006/0237725 A1 | 10/2006 | Jeong | |
| 2006/0284247 A1 * | 12/2006 | Augustine | H01L 21/8258 257/338 |
| 2007/0007621 A1 | 1/2007 | Omura et al. | |
| 2007/0069240 A1 * | 3/2007 | Passlack | H01L 29/41775 257/192 |
| 2007/0126478 A1 | 6/2007 | Kapoor | |
| 2007/0267698 A1 | 11/2007 | Bernstein et al. | |
| 2008/0029816 A1 | 2/2008 | Leonardi et al. | |
| 2008/0070355 A1 * | 3/2008 | Lochtefeld | H01L 21/823412 438/172 |
| 2008/0203501 A1 | 8/2008 | Yamazaki | |
| 2009/0146186 A1 * | 6/2009 | Kub | H01L 29/1602 257/194 |
| 2009/0267233 A1 | 10/2009 | Lee | |
| 2009/0321794 A1 * | 12/2009 | Kim | H01L 21/823807 257/255 |
| 2010/0117095 A1 | 5/2010 | Zhang | |
| 2010/0258841 A1 * | 10/2010 | Lidow | H01L 29/1066 257/192 |
| 2010/0295104 A1 * | 11/2010 | Kaper | H01L 21/8258 257/288 |
| 2010/0301396 A1 * | 12/2010 | Briere | H01L 21/8221 257/195 |
| 2011/0018002 A1 | 1/2011 | Chen | |
| 2011/0027968 A1 | 2/2011 | Yamazaki et al. | |
| 2011/0121366 A1 | 5/2011 | Or-Bach | |
| 2011/0180806 A1 * | 7/2011 | Hebert | H01L 21/76281 257/76 |
| 2011/0193166 A1 | 8/2011 | Liang et al. | |
| 2011/0215407 A1 * | 9/2011 | Tang | H01L 21/76254 257/348 |
| 2011/0233617 A1 | 9/2011 | Or-Bach et al. | |
| 2011/0248283 A1 * | 10/2011 | Cao | H01L 29/41725 257/76 |

(56) References Cited

U.S. PATENT DOCUMENTS

| | | |
|---|---|---|
| 2011/0260703 A1 | 10/2011 | Laur |
| 2011/0298021 A1 | 12/2011 | Tada et al. |
| 2012/0032236 A1 | 2/2012 | Yamazaki et al. |
| 2012/0061681 A1 | 3/2012 | Thei |
| 2012/0112257 A1 | 5/2012 | Kato |
| 2012/0181510 A1* | 7/2012 | Avouris ............... H01L 27/0688 257/29 |
| 2012/0193688 A1* | 8/2012 | Lidow ............... H01L 21/26546 257/288 |
| 2012/0273773 A1* | 11/2012 | Ieda ..................... H01L 27/105 257/43 |
| 2013/0043598 A1 | 2/2013 | Chen et al. |
| 2013/0049814 A1 | 2/2013 | De Rooij |
| 2013/0126889 A1 | 5/2013 | Bahl |
| 2013/0134519 A1 | 5/2013 | Sengoku |
| 2013/0175524 A1 | 7/2013 | Omura et al. |
| 2013/0234145 A1* | 9/2013 | Hirler ................. H01L 21/8258 257/76 |
| 2013/0288426 A1* | 10/2013 | Akimoto ........... H01L 29/66765 438/104 |
| 2014/0015106 A1 | 1/2014 | Hsieh |
| 2014/0184334 A1 | 7/2014 | Nobbe |
| 2014/0231874 A1 | 8/2014 | Hoshi et al. |
| 2014/0300410 A1 | 10/2014 | Buthker |
| 2014/0327010 A1* | 11/2014 | Pendharkar ......... H01L 27/0255 257/76 |
| 2014/0361371 A1* | 12/2014 | Comeau .............. H01L 27/1203 257/351 |
| 2014/0374765 A1 | 12/2014 | Curatola |
| 2015/0340483 A1 | 11/2015 | Briere |
| 2015/0371987 A1 | 12/2015 | Pan |
| 2016/0049504 A1* | 2/2016 | Renaldo .............. H01L 29/7783 257/20 |
| 2016/0056817 A1 | 2/2016 | Kinzer |
| 2016/0079975 A1 | 3/2016 | Kinzer |
| 2016/0105173 A1 | 4/2016 | De Rooij |
| 2017/0054067 A1* | 2/2017 | Zhang .................. H01L 29/423 |
| 2017/0200648 A1* | 7/2017 | Lee ..................... H01L 21/8258 |

FOREIGN PATENT DOCUMENTS

| | | |
|---|---|---|
| JP | 2000-196096 A | 7/2000 |
| JP | 2009-158528 A | 7/2009 |
| JP | 2012-523700 A | 10/2012 |
| JP | 2013-98317 A | 5/2013 |

* cited by examiner

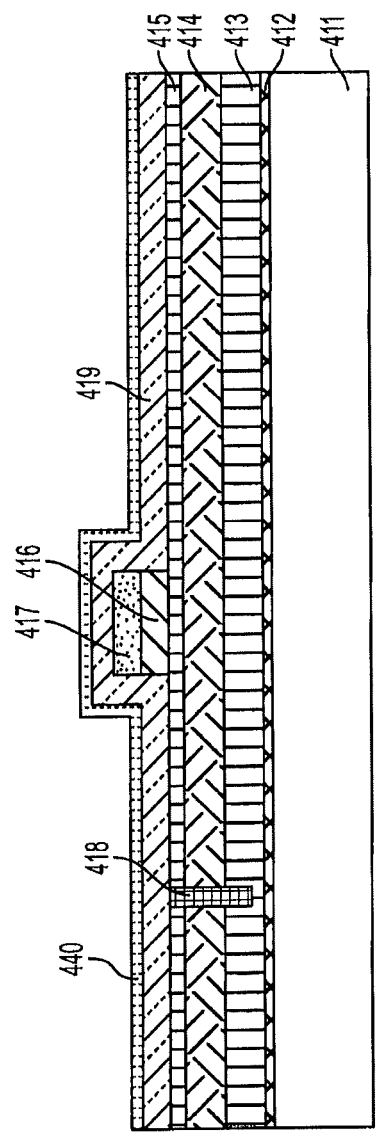

GAN TRANSISTORS WITH POLYSILICON LAYERS USED FOR CREATING ADDITIONAL COMPONENTS

CROSS-REFERENCE TO RELATED APPLICATIONS

This is a divisional of application Ser. No. 14/959,710, filed on Dec. 4, 2015, which is a divisional of application Ser. No. 14/445,988, filed on Jul. 29, 2014, now U.S. Pat. No. 9,214,461, which claims the benefit of U.S. Provisional Application No. 61/859,519, filed on Jul. 29, 2013, and U.S. Provisional Application No. 61/978,014, filed on Apr. 10, 2014, the entire contents of each of which are hereby incorporated by reference.

BACKGROUND OF THE INVENTION

1. Field of the Invention

The present invention relates to the field of gallium nitride (GaN) devices and, more particularly, to the fabrication of GaN integrated circuits using one or more polysilicon layers to fabricate active and passive silicon devices.

2. Description of the Related Art

Gallium nitride (GaN) semiconductor devices are increasingly desirable because of their ability to switch at high frequency, to carry large current, and to support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET). These types of devices can typically withstand high voltages, e.g., 30V-to-2000 Volts, while operating at high frequencies, e.g., 100 kHZ-100 GHz.

A GaN HEMT device includes a nitride semiconductor with at least two nitride layers. Different materials formed on the semiconductor or on a buffer layer causes the layers to have different band gaps. The different material in the adjacent nitride layers also causes polarization, which contributes to a conductive two dimensional electron gas (2DEG) region near the junction of the two layers, specifically in the layer with the narrower band gap.

The nitride layers that cause polarization typically include a barrier layer of AlGaN adjacent to a layer of GaN to include the 2DEG, which allows charge to flow through the device. This barrier layer may be doped or undoped. Because the 2DEG region exists under the gate at zero gate bias, most gallium nitride devices are normally on, or depletion mode devices. If the 2DEG region is depleted, i.e. removed, below the gate at zero applied gate bias, the device can be an enhancement mode device. Enhancement mode devices are normally off and are desirable because of the added safety they provide and because they are easier to control with simple, low cost drive circuits. An enhancement mode device requires a positive bias applied at the gate in order to conduct current.

FIGS. 1A-1H illustrate a conventional manufacturing process for fabricating an enhancement mode (normally off) GaN transistor. As shown in FIG. 1A, the exemplary device is formed by first depositing a number of layers on a substrate 10, formed from silicon (Si), silicon carbide (SiC) or the like. In particular, an aluminum nitride (AlN) seed layer 11 is deposited on the substrate 10, an aluminum gallium nitride (AlGaN) layer 12 is formed on the seed layer 11, and one or more gallium nitride (GaN) layers 13 with different kinds of doping are formed on the AlGaN layer 12. Furthermore, an aluminum gallium nitride (AlGaN) barrier layer 14 is formed on the GaN layer 13, a pGaN layer 15 is formed on the barrier layer 14, and a gate metal 16 is formed on the pGaN layer 15. As further shown in FIG. 1A, a photoresist 17 is deposited as a protecting layer on the gate metal 16 to define the gate pattern using the photoresist.

Next, as shown in FIG. 1B, the gate metal 16 and the pGaN material (i.e., crystal) 15 are etched with the photoresist 17 serving as the protecting layer. As then shown in FIGS. 1C and 1D, an insulating layer or film 18 is deposited and contact openings 19A and 19B are formed for the source and drain contacts. Next, a first aluminum metal is deposited to define the metal pattern. As shown in FIG. 1E, the metal layer can form the source metal 20A, the drain metal 20B, and optionally a field plate 20C. An interlayer dielectric is then deposited as shown in FIG. 1F. In this example, the insulator 18 is the same material as that deposited in FIG. 1C.

Once the interlayer dielectric 18 is deposited, vias 22A and 22B can be cut between metal layers as shown in FIG. 1G. The vias can be filled with tungsten to form a plug and a second aluminum metal layer can be deposited to form metals 21A and 21B. This step can be performed again as shown in FIG. 1H with additional vias cut 24A and 24B and additional metals 23A and 23B formed. A passivation layer 25 can then be deposited over the third aluminum metals 23A and 23B. FIG. 2 shows a scanning electron micrograph of the GaN structure formed by the process of FIGS. 1A-1H.

One limitation of the process described above in FIGS. 1A-1H is that the device fabricated is a single enhancement mode device on a chip. A second limitation is that a GaN HEMT device, as mentioned above, uses a highly conductive electron gas (2DEG), and is therefore an n-channel transistor. However, it is difficult to make a p-channel transistor due to very poor hole mobility in gallium nitride. Moreover, it is also difficult to fabricate other types of silicon devices in gallium nitride.

Accordingly, it would be desirable to have a process for forming GaN integrated circuits that include silicon active and inactive components that have otherwise been difficult to fabricate in gallium nitride.

SUMMARY OF THE INVENTION

GaN transistor devices are disclosed herein that include polysilicon layers for creating additional components for an integrated circuit and a method for manufacturing the same. The GaN device includes an EPI structure and an insulating material disposed over EPI structure. Furthermore, one or more polysilicon layers are disposed in the insulating material with the polysilicon layers having one or more n-type regions and p-type regions. The device further includes metal interconnects disposed on the insulating material and vias disposed in the insulating material layer that connect source and drain metals to the n-type and p-type regions of the polysilicon layer.

A method for manufacturing the GaN transistor device includes forming an EPI structure having a substrate, an AlGaN layer over the substrate, a GaN layer over the AlGaN layer, a barrier layer over the AlGaN layer, and a p-type GaN layer over the barrier layer; depositing a gate metal on the p-type GaN layer; and forming a photoresist over the gate metal and etching the gate metal and the p-type GaN layer. The method further includes depositing a first insulating layer; etching the first insulating layer to form a pair of contact windows in the insulating material; and forming a source metal and a drain metal in the pair of contact windows. Next, a second insulating layer is deposited and a polysilicon layer is deposited on the second insulating layer. After the polysilicon layer is deposited, the manufacturing method further includes the steps of doping the polysilicon layer to form at least one n-type region and at least one p-type region in the polysilicon layer; depositing a third insulating layer and forming a first plurality of vias in the third insulating layer that are respectively coupled to the source metal, the drain metal, the at least one n-type region of the polysilicon layer and the at least one p-type region of the polysilicon layer; and forming a metal layer on the third insulating layer.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein:

FIGS. 9A-9I illustrate an exemplary manufacturing process using a polysilicon layer to fabricate the devices in an GaN integrated circuit as shown in FIG. 8.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made as well as variations in the materials used to form the various layers of the integrated circuits disclosed herein. The combinations of features disclosed in the following detailed description may not be necessary to practice the teachings in the broadest sense, and are instead taught merely to describe particularly representative examples of the present teachings.

FIGS. 3A-3H illustrate an exemplary manufacturing process using a polysilicon layer to fabricate active and passive silicon devices in an GaN integrated circuit according to a first embodiment of the present invention.

The initial steps of the first exemplary embodiment of the manufacturing process described herein employ the same or similar steps as those described above with respect to FIGS. 1A-1F of a conventional fabrication technique of a GaN transistor. In particular, an EPI structure includes a seed layer (e.g., aluminum nitride (AlN)) that is deposited on a substrate, formed from silicon (Si), silicon carbide (SiC) or the like. Further, one or more transition layers (e.g., aluminum gallium nitride (AlGaN)) are formed on the seed layer, and a channel layer (e.g., a gallium nitride (GaN) layer) is formed on the AlGaN layer. A barrier layer composed of aluminum gallium nitride (AlGaN), for example, is then formed on the channel layer, such that a two dimensional electron gas (2DEG) is formed at the junction between the channel layer and the barrier layer.

In the exemplary embodiment, to form the gate a pGaN layer is formed on the barrier layer, and a gate metal is formed on the pGaN layer. Next, a photoresist is deposited as a protecting layer on the gate metal to define the gate pattern using the photoresist and the gate metal and pGaN material are etched. An insulating layer is then deposited and contact openings are formed in the insulating layer for the source and drain contacts. Next, an aluminum metal is deposited to define the source metal, the drain metal, and optionally a field plate. An interlayer dielectric is then deposited on the metal contacts.

Figure 1A:
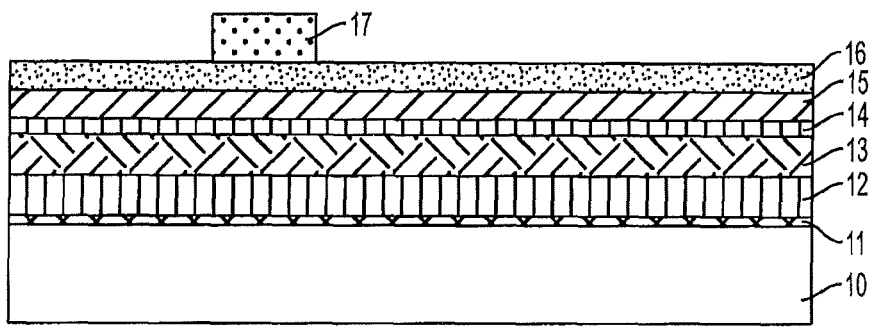
FIGS. 1A-1H illustrate a conventional manufacturing process for fabricating an enhancement mode (normally off) GaN transistor.
Figure 1B:
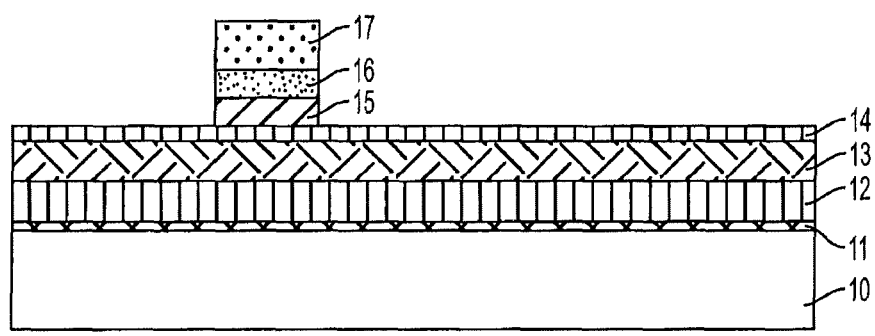
Figure 1C:
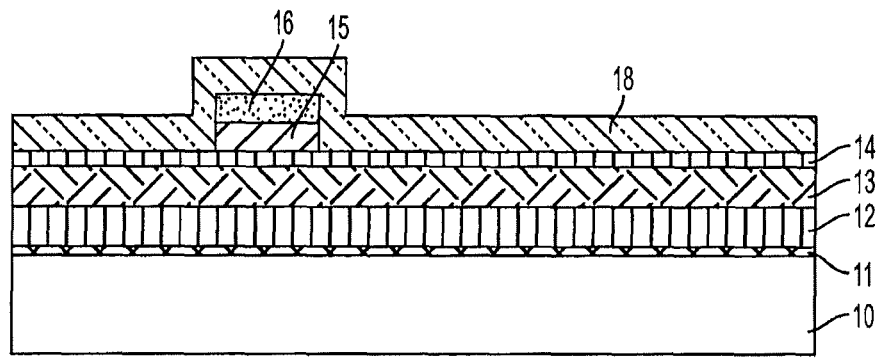
Figure 1D:
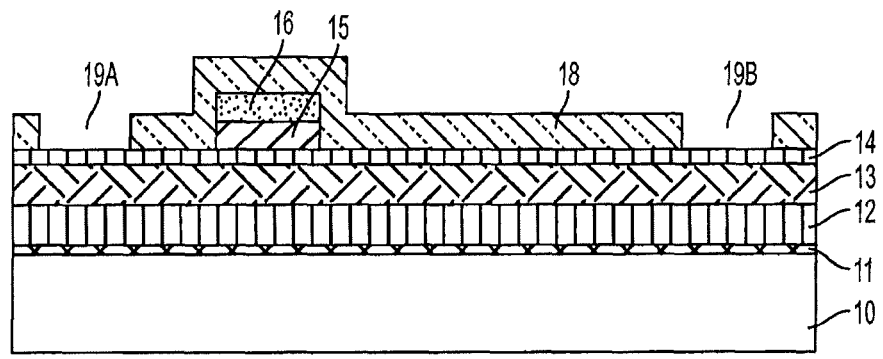
Figure 1E:
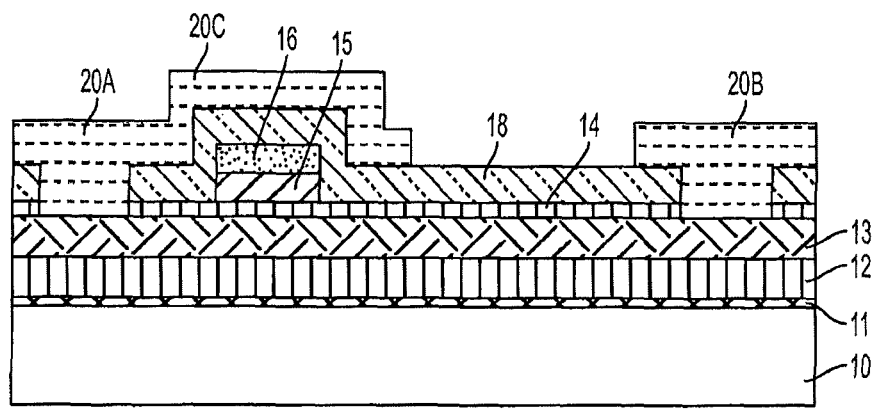
Figure 1F:
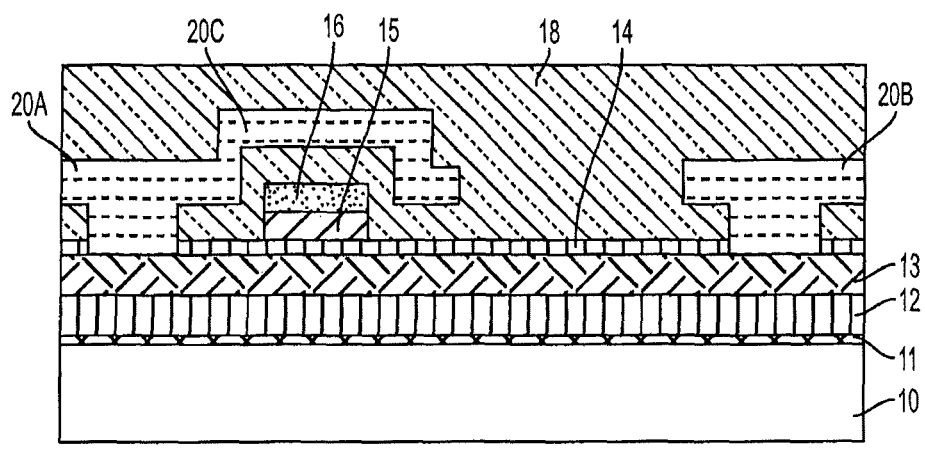
Figure 1G:
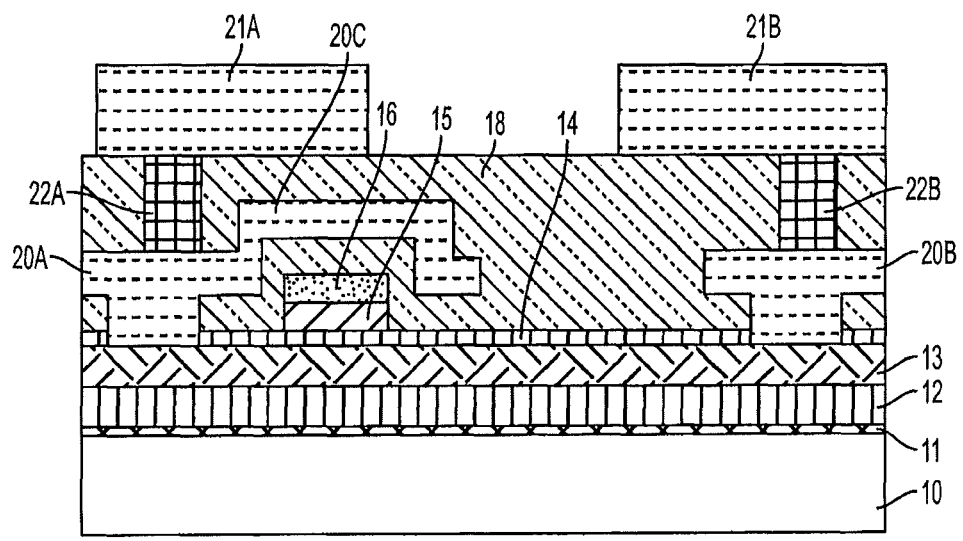
Figure 1H:
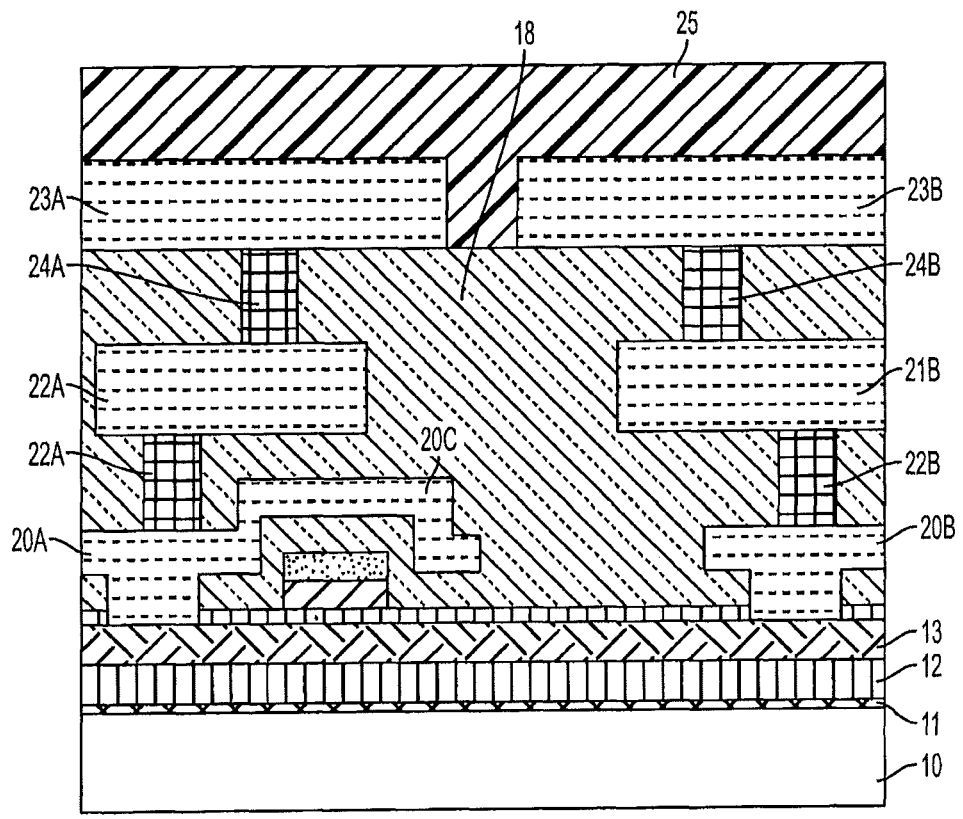
Figure 2:
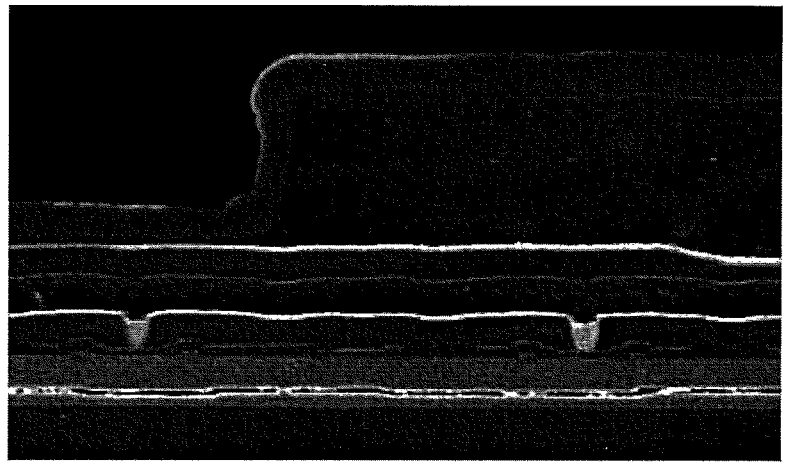
FIG. 2 illustrates shows a scanning electron micrograph of the GaN structure formed by the process of FIGS. 1A-1H.
Figure 3A:
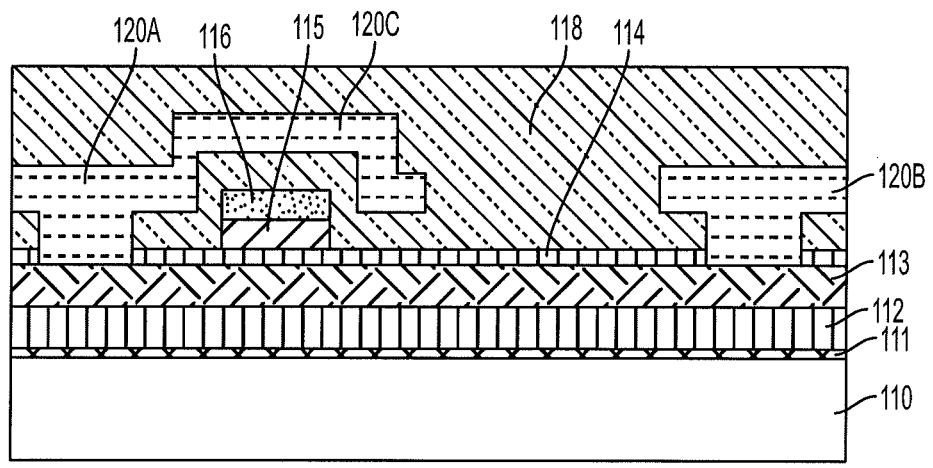
FIGS. 3A-3H illustrate an exemplary manufacturing process using a polysilicon layer to fabricate active and passive silicon devices in an GaN integrated circuit according to a first embodiment of the present invention.

FIG. 3A illustrates the resulting structure from these preliminary manufacturing steps. As shown, a substrate 110 is provided with an AN seed layer 111, an AlGaN layer 112, a channel layer 113 comprised of GaN or the like, and an AlGaN barrier layer 114 formed thereon, from bottom layer to top layer. Furthermore, a gate contact comprised of the pGaN layer 115 and the gate metal 116 is formed on the AlGaN barrier layer 114, as well as source metal 120A, drain metal 120B and field plate 120C. Furthermore, an insulator 118 is disposed over the metal contacts and barrier layer. It is noted that while the gate contact/structure is formed using a patterned photoresist over the pGaN layer 115 and the gate metal 116 in the exemplary embodiment (as described above), the gate contact/structure can be formed using alternative methods as would be understood to one skilled in the art. For example, the gate structure can be a recessed gate formed in the barrier layer 114, and F-implanted (fluorine implanted) gate, or any other method for forming an enhancement mode device.

Figure 3B:
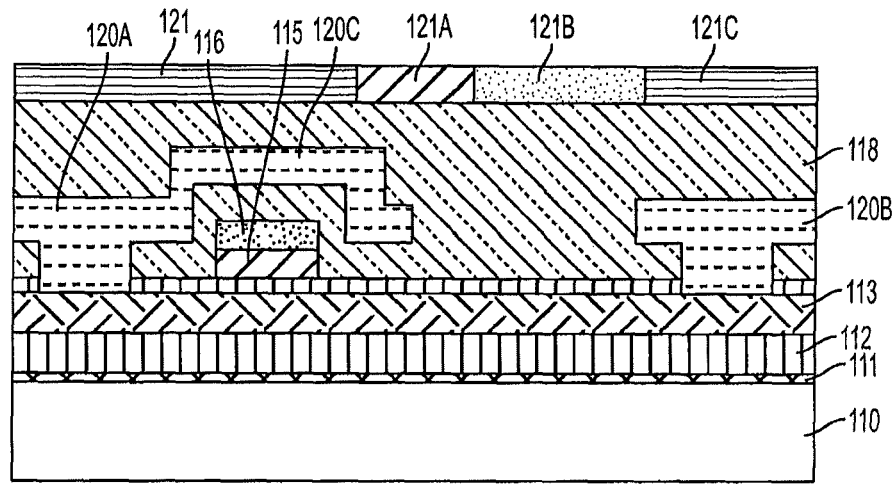
Figure 3C:
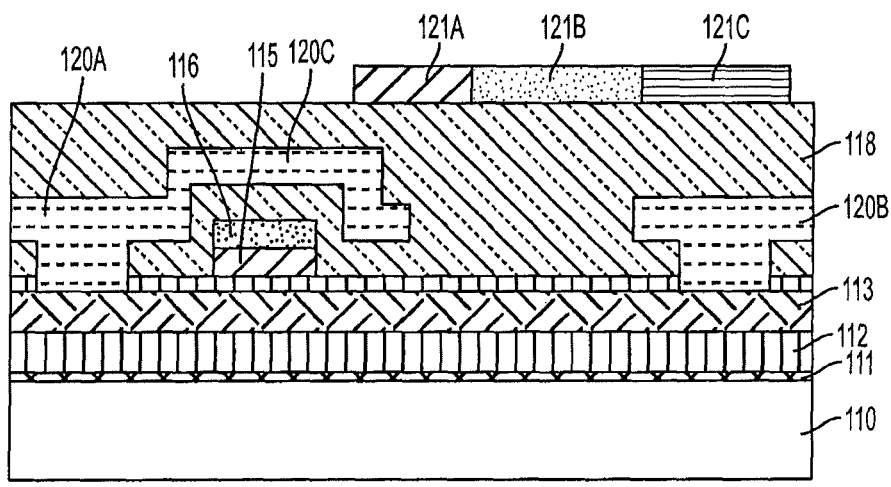

Next, as shown in FIG. 3B, a layer of polysilicon 121 is deposited on the insulating layer 118 and impurities are implanted to define regions with p-type doping, n-type doping and/or no doping. These regions will form the basis for p-n diodes, npn and pnp transistors, resistors, capacitors, and other active and passive elements. In the example shown in FIG. 3, the polysilicon layer 121 includes an n-type region 121A, a p-type region 121B, and an undoped region 121C. A contact photo mask is then used to pattern and etch the polysilicon layer 121 as shown in FIG. 3C.

Figure 3D:
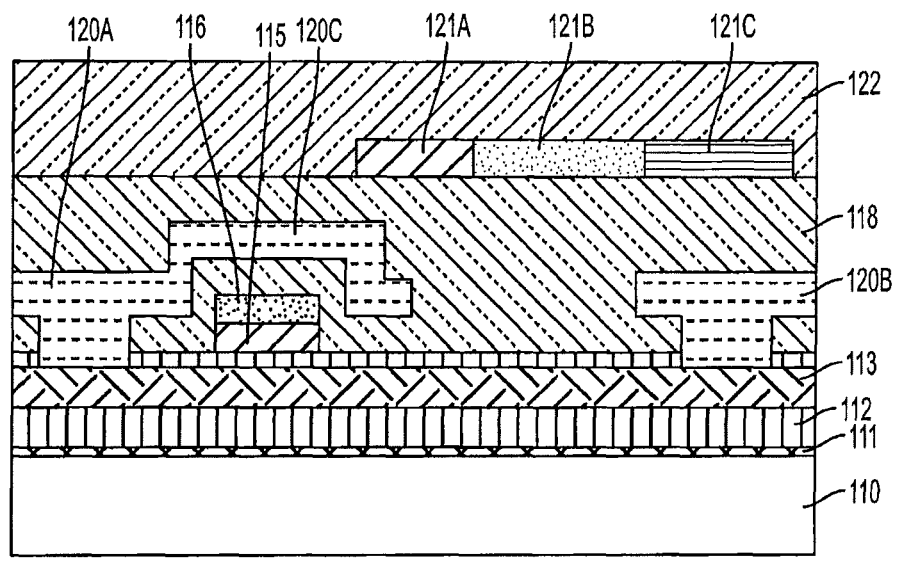
Figure 3E:
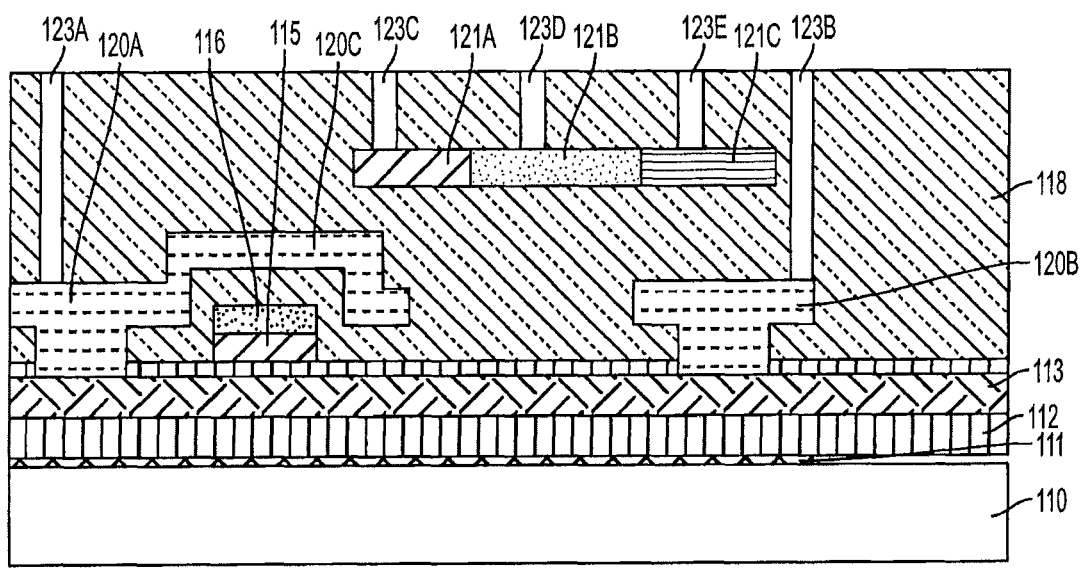

Next, as shown in FIG. 3D, an insulating layer 122 is then deposited over the polysilicon layer 121. Vias 123A-123E are then formed in the insulating layer 122 and insulating layer 118 (collectively shown as insulating layer 118 in FIG. 3E). In particular, via 123A connects source metal 120A, via 123B connects drain metal 120B, via 123C connects n-type region 121A, via 123D connects p-type region 121B, and via 123E connects the undoped region 121C. In the exemplary embodiment, tungsten (W) or copper (Cu) plug technologies can be applied to the filling of smaller, higher aspect ratio vias 123A-123E, while utilizing thin layers of TiN in a range of 0.01 to 0.1 µm thick for contacting the regions of the polysilicon layer 121. It should be appreciated that although vias are used in the exemplary embodiment, the connection to the metal and polysilicon can be done in many ways common in the industry.

Figure 3F:
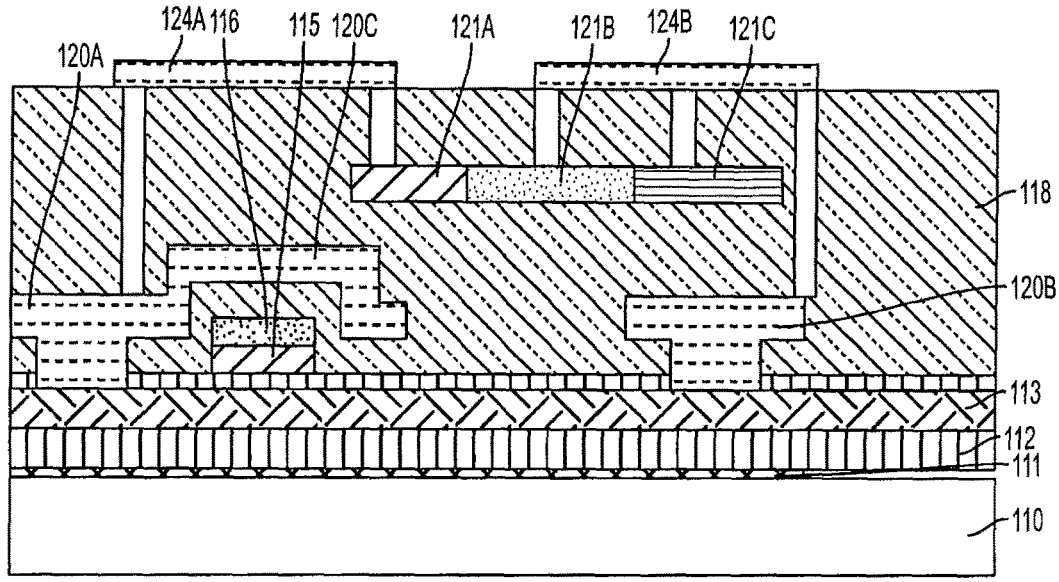

Turning to FIG. 3F, a metal layer is deposited to create interconnects, thereby adding silicon active and passive components to the GaN transistor. In particular, as shown in the exemplary embodiment, a metal layer 124A electrically couples vias 123A and 123C and a second metal layer 124B electrically couples via 123B, 123D, and 123E.

Figure 3G:
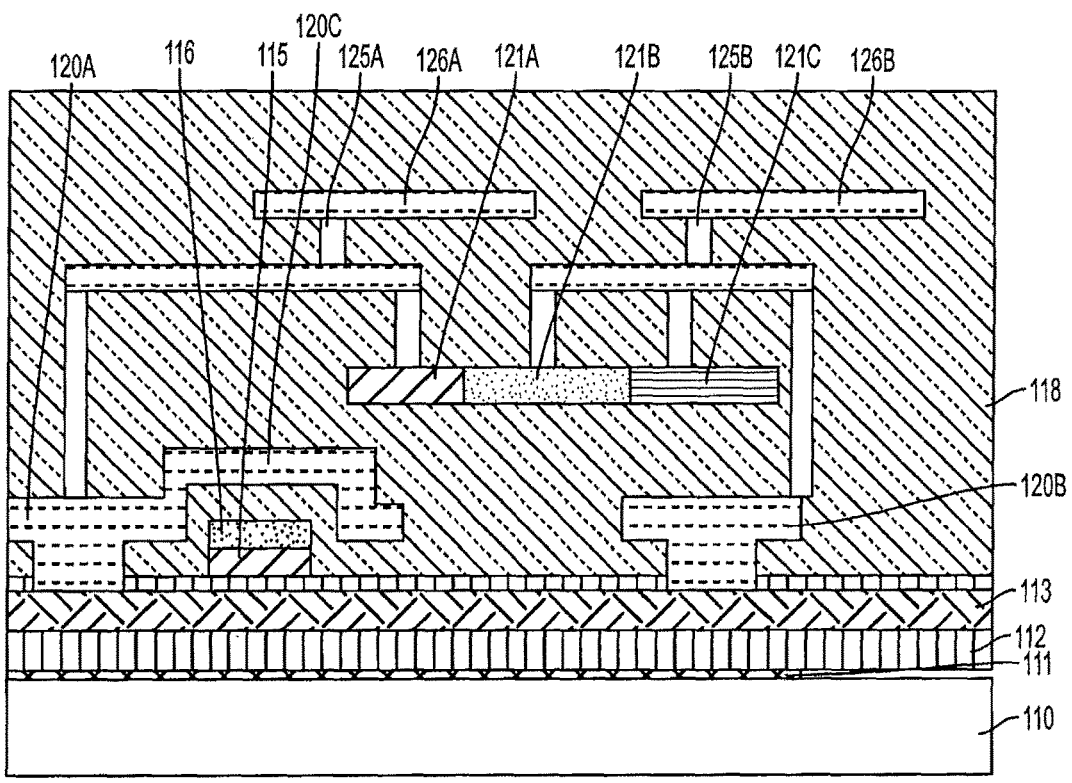
Figure 3H:
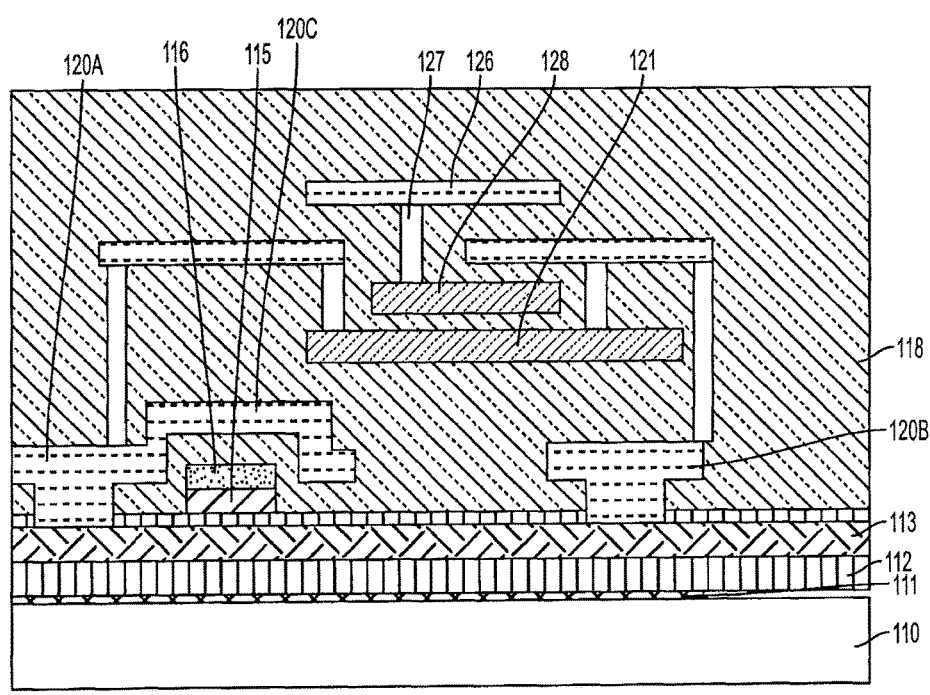

In one refinement, additional vias 125A and 125B and additional metal layers 126A and 126B can also be formed to the device as illustrated in FIG. 3G. Alternatively or in addition thereto, a second polysilicon layer can be formed as shown in FIG. 3H. In particular, the second polysilicon layer 128 and coupled to another metal layer 126 by via 127. In the exemplary embodiment, the second polysilicon layer 128 can be added to form n-channel and p-channel MOSFETs. FIG. 3H shows interconnects to two polysilicon layers 121 and 128. The drain and source electrodes of a MOSFET are defined in polysilicon layers 121 and the gate electrode is defined in polysilicon layer 128. As shown in both FIGS. 3G and 3H, the top-gate polysilicon device includes source and drain contacts that are coupled to the source and drain of the GaN FET disposed on barrier layer 114. It is reiterated that in an alternative embodiment, the source and drain contacts of the polysilicon FET are not coupled to the GaN FET, but instead left open for external connections, e.g., one or both of them could be connected to a metal interconnected and/or connected externally. Yet further, one of either the source and drain contacts could be coupled to the GaN FET while the other contact could be connected externally. These variations of the integrated device are contemplated by the disclosure herein and can be manufactured using the methods described in FIGS. 3A-3F with appropriate variations thereof.

In addition, it should be appreciated that many variations and modifications can be made to the exemplary manufacturing method illustrated in FIGS. 3A-3H. For example, as shown in FIG. 3H, an n-channel and/or p-channel MOS device can be added by oxidizing the polysilicon and adding a metal or polysilicon gate electrode. Moreover, multiple polysilicon layers can be added to create additional components such as poly-poly capacitors as well as the gates to polysilicon MOSFETs. Further, silicon components can be used to create gate over voltage protection for the GaN transistor. Finally, the polysilicon can be used to create drain-source overvoltage protection for the GaN transistor and/or to create CMOS components that can be used in conjunction with the GaN transistor on the same chip.

Figure 4A:
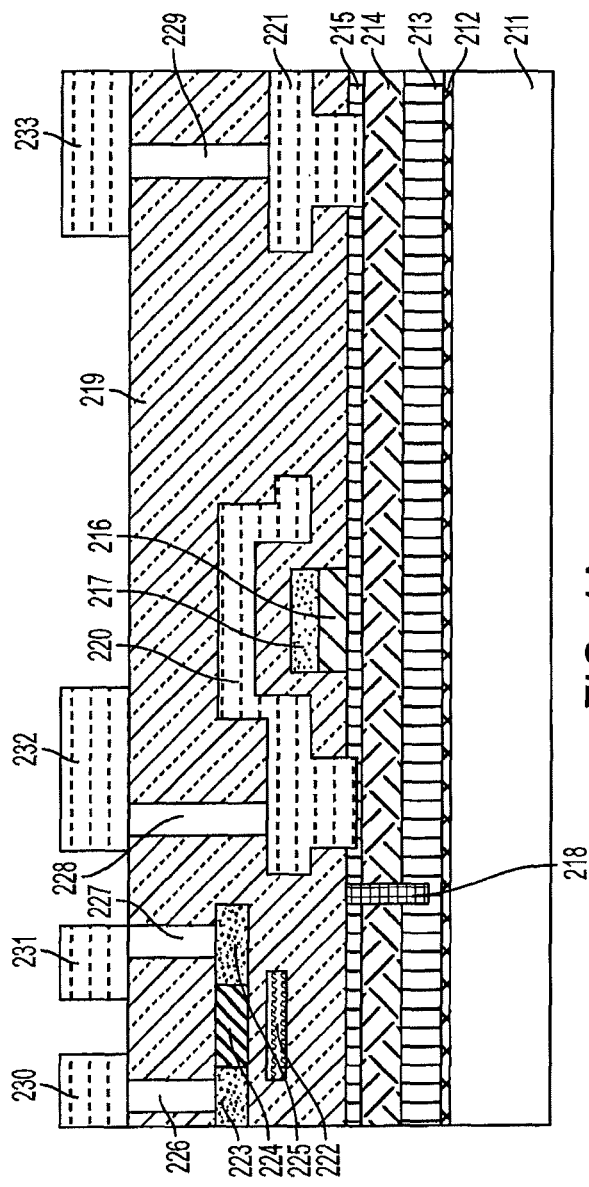
FIGS. 4A and 4B illustrate additional embodiments of a GaN integrated circuit according to an exemplary embodiment of the present invention.
Figure 4B:
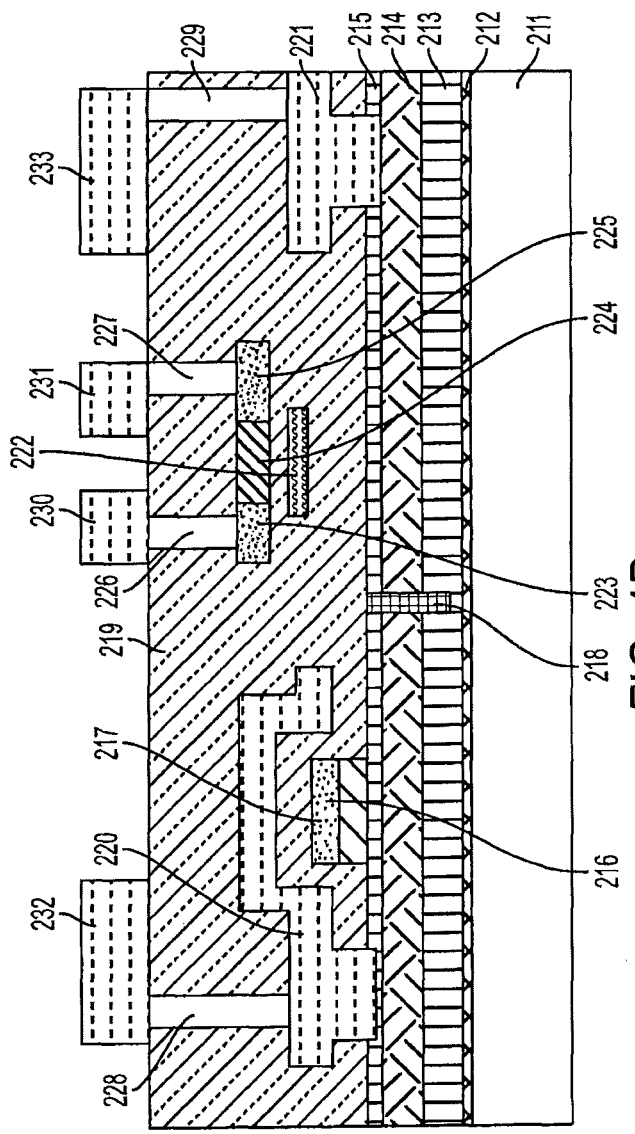

FIGS. 4A and 4B illustrate additional embodiments of a GaN integrated circuit according to an exemplary embodiment of the present invention. In particular, FIG. 4A illustrates a GaN integrated circuit having a bottom gate polysilicon device structure. As shown, the GaN device is formed on a substrate 211, one or more transistor layers 212 (e.g., an AlN seed layer), a buffer layer 213 (e.g., an AlGaN layer), a channel layer 214 (e.g., GaN) and an AlGaN barrier layer 215. These layers are similar to the structure described about with reference to the first embodiment. As noted above, a 2DEG region is formed at the junction between the channel layer 214 and the barrier layer 215.

As further shown, a pGaN layer 216 and gate metal 217 are formed on the barrier layer 215 and form the gate structure. Source and drain metals 220 and 221 are formed on the barrier layer 215 with vias 228 and 229 electrically connecting the source and drain metals 220 and 221 to metal contacts 232 and 233, respectively. Furthermore, an isolation region 218 is formed by ion implantation or etching in the barrier layer 215, the channel layer 214 and extending into the buffer layer 213. The isolation region formed in the barrier layer and the channel layer electrically isolates a first portion of the 2DEG region from a second portion of the 2DEG region. The device further includes an insulating material 219 that electrically insulates and protects the device metals. As shown, a bottom gate 222 of the polysilicon FET is formed in the insulating material. It is noted that the bottom gate 222 can be a metal, polysilicon or other conductive material. It should be appreciated that the gate structure is formed above one portion of the 2DEG region while the bottom or back gate 222 is formed above a second portion of the 2DEG region that is isolated from the first region.

Furthermore, a polysilicon layer is formed above the bottom gate. In particular, the polysilicon layer can comprise an n-type region 223, a p-type region 224 and an n-type region 225 (i.e., an NPN layer for the source, channel and drain of the device), although it should be appreciated that the regions can be reversed to form a PNP layer. Vias 226 and 227 couple the doped regions 223 and 225, respectively to metal contacts 230 and 231. Accordingly, the device shown in FIG. 4A includes a bottom gate structure for a polysilicon FET that is disposed in an area of the circuit isolated from the active cells of the GaN FET.

FIG. 4B illustrates an alternative embodiment of the device illustrated in FIG. 4A. The layers and components of the device in FIG. 4B are the same as 4A and will not be repeated herein. The device shown in FIG. 4B differs in that the polysilicon FET 222 is formed in the active region of the circuit rather than the isolated region as it is disposed in the device shown in FIG. 4A.

FIGS. 5A-5J illustrate an exemplary manufacturing process using a polysilicon layer to fabricate the devices in an GaN integrated circuit as shown in FIGS. 4A and/or 4B. All process flows can be used to form bottom gate polysilicon FETs in both the active device area (FIG. 4B) or in the isolation area (FIG. 4A). A back gate formed by the polysilicon/gate metal prevents the effect of the 2DEG potential on the polysilicon FET.

Figure 5A:
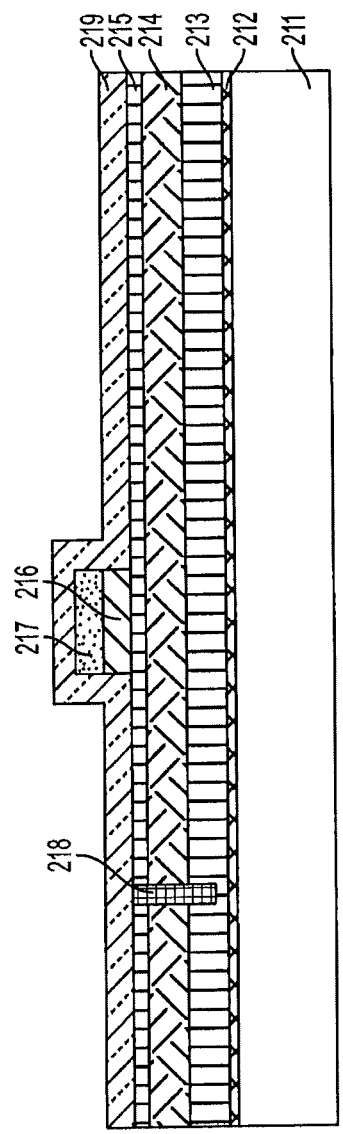
FIGS. 5A-5J illustrate an exemplary manufacturing process using a polysilicon layer to fabricate the devices in an GaN integrated circuit as shown in FIGS. 4A and/or 4B.

FIG. 5A illustrates an EPI structure, including, from bottom to top, silicon substrate 211, transition layers 212, a buffer material 213 (e.g., AlGaN), a channel layer 214 (e.g., GaN), and an barrier material 215 (e.g., AlGaN. Furthermore, a p-type GaN material 216 is formed on the barrier material 215 and a gate metal 217 is formed (i.e., deposited or grown) on the p-type GaN material 216. After a photoresist is deposited and the gate metal 217 and the p-type GaN material 216 are etched by any known technique, e.g., plasma etching, an isolation region 218 is then formed, an insulating material 219 is deposited over the EPI structure. Isolation region 218 can be formed by covering the portion of device layer 215 and then etching down the exposed layers, at least below the channel layer 214. The etched region can then be filled with oxide or other suitable isolating materials.

Figure 5B:
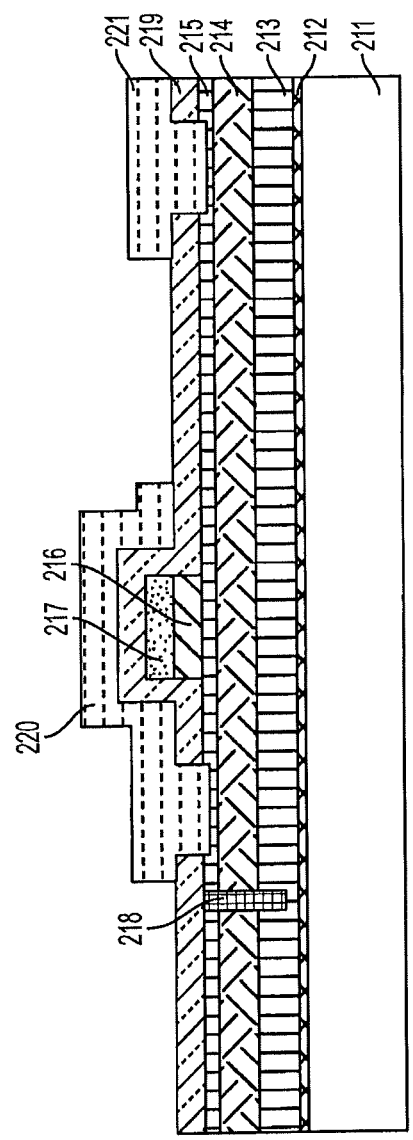
Figure 5C:
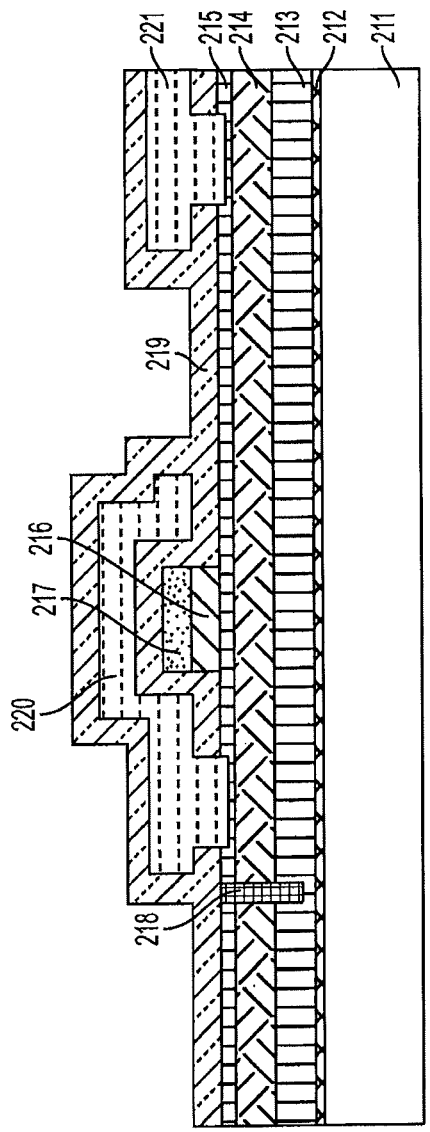
Figure 5D:
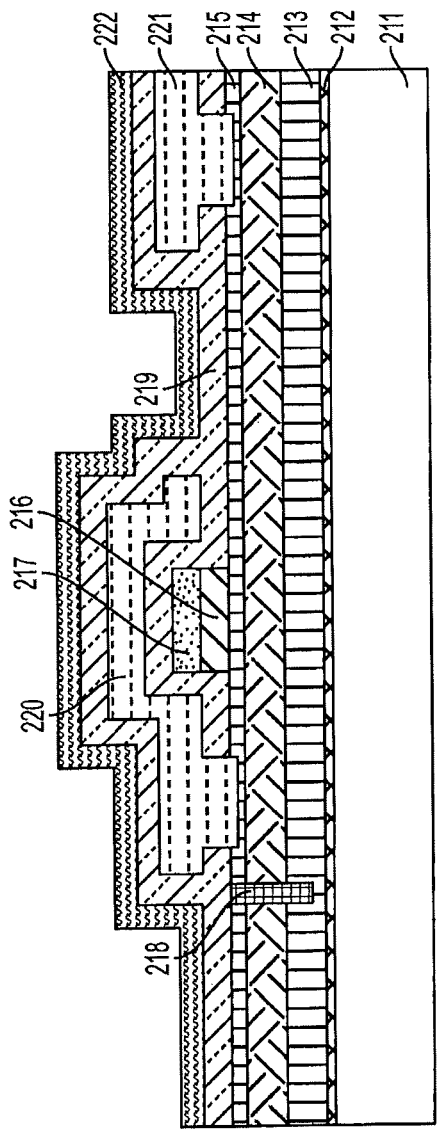
Figure 5E:
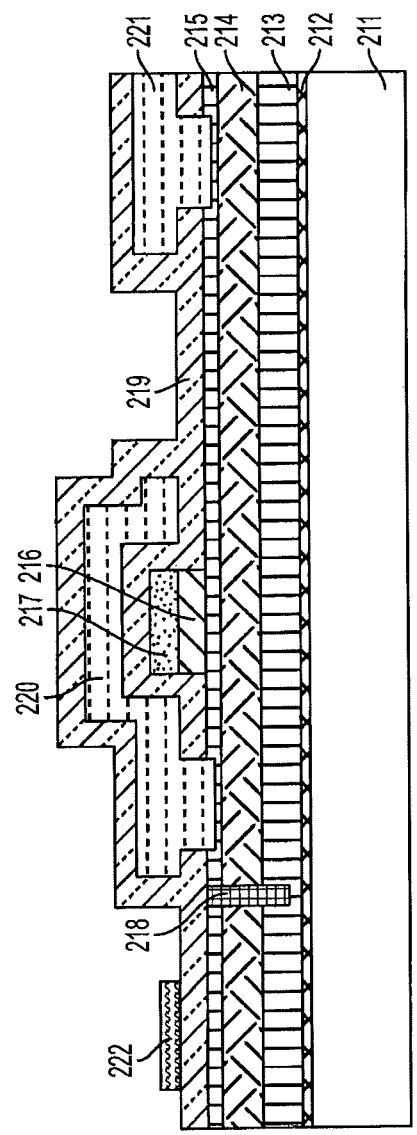

Next, as shown in FIG. 5B, the insulating material is etched using a contact photo mask to form contact openings and contact metals are deposited to form the source metal 120, drain metal 121, and optionally a field plate. As before, an insulating material is then deposited on the structure, which is again shown as insulating material 119 in FIG. 5C. A bottom gate metal 222 is then deposited on the insulating material 219 as shown FIG. 5D and then etched as shown in FIG. 5E. The etched gate metal forms the bottom gate for the polysilicon FET as discussed above.

Figure 5F:
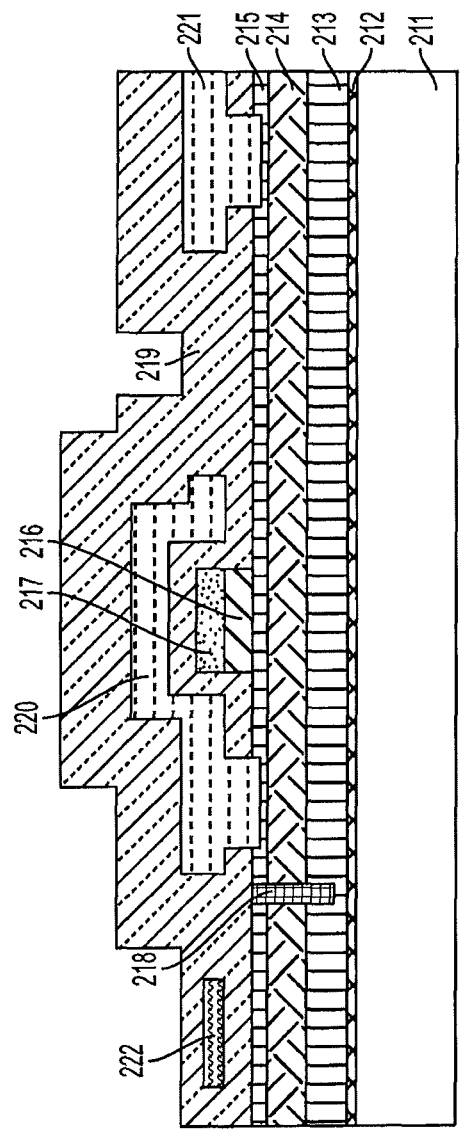
Figure 5G:
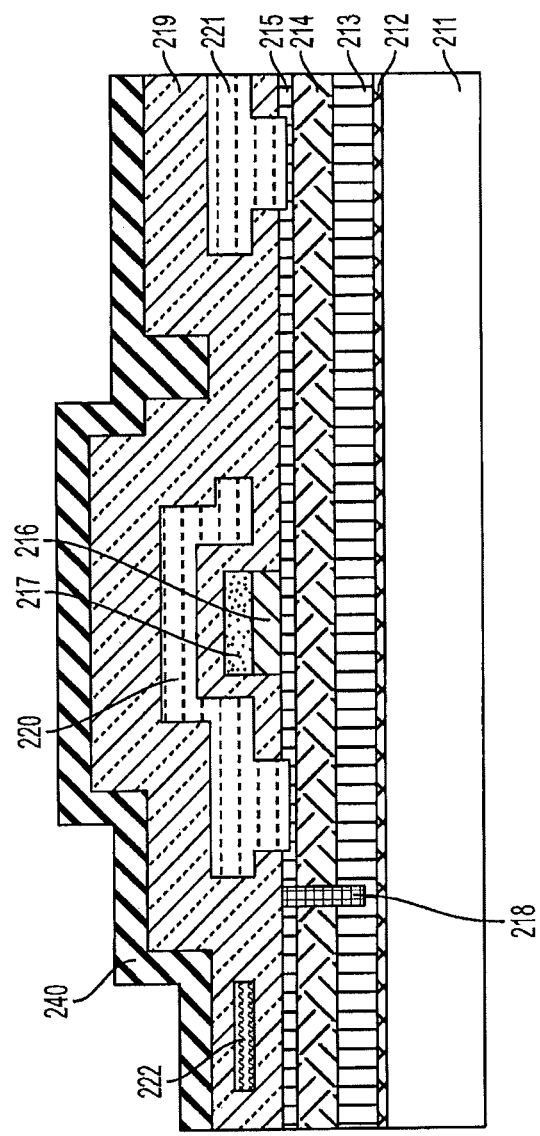
Figure 5H:
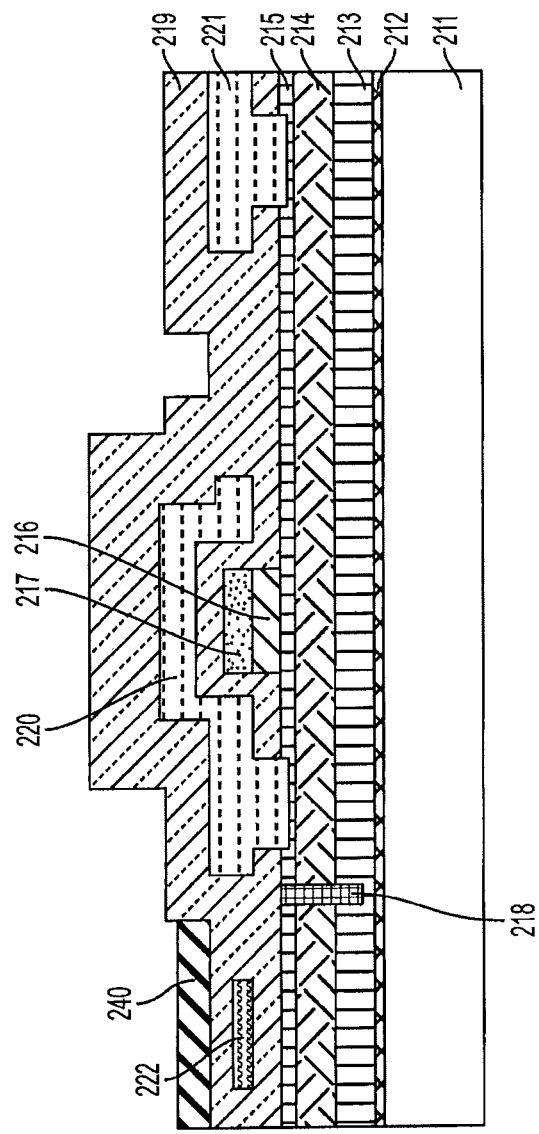
Figure 5I:
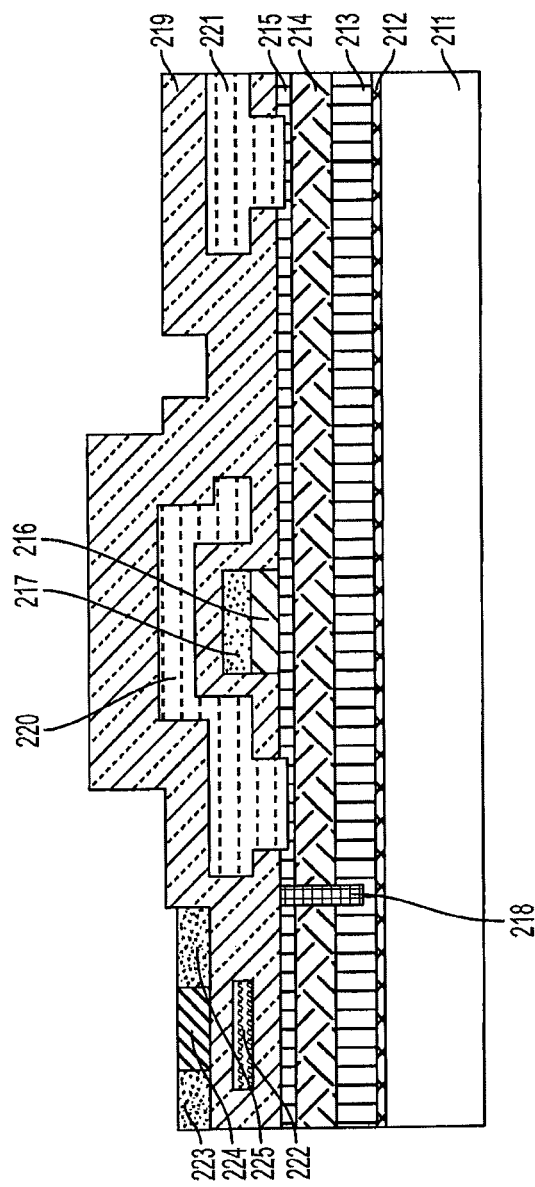

The manufacturing process continues to FIG. 5F in which a gate insulator is deposited for the polysilicon FET. The gate insulator is illustrated as insulating material 219. Next, a polysilicon layer 240 is then deposited as shown in FIG. 5G and then etched as shown in FIG. 5H. In the exemplary embodiment, the polysilicon layer 240 is etched such that the remaining portion of the layer is formed over the gate metal 222. Next, as illustrated in FIG. 5I, a step of masking and ion implanting the polysilicon layer is performed to form NPN or PNP layers. As noted above, ion implanting of the polysilicon layer can result in an n-type region 223, a p-type region 224 and an n-type region 225 (i.e., an NPN layer for the source, channel and drain of the device) or, alternatively, a PNP layer.

Figure 5J:
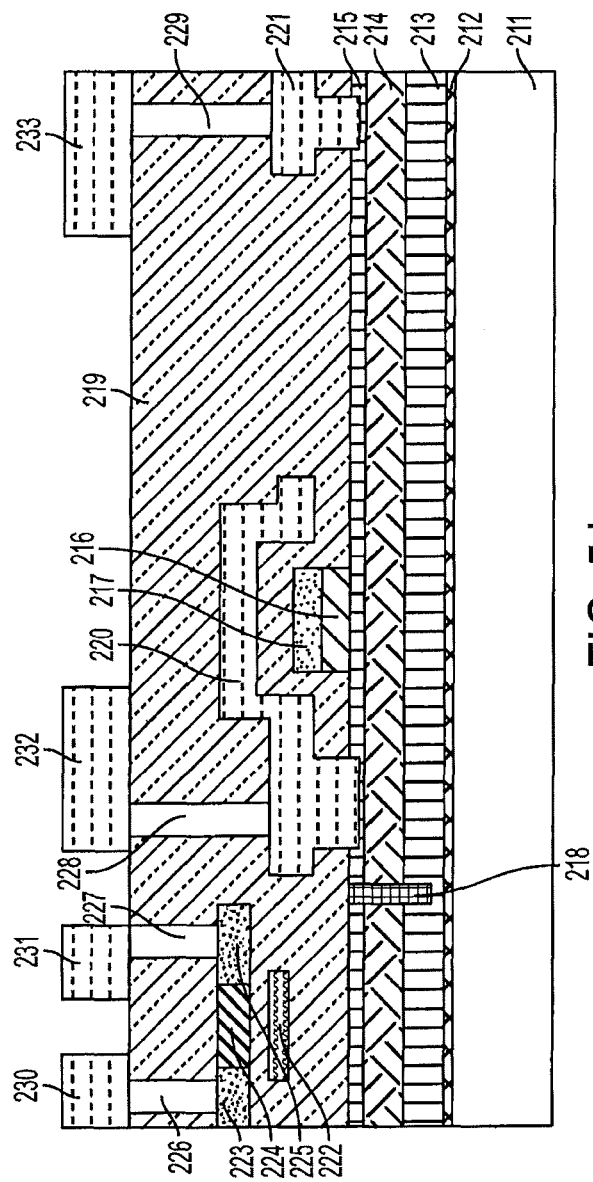

Finally, as shown in FIG. 5J, an additional dielectric material is deposited (again shown as dielectric material 219), a plurality of vias are formed in the dielectric material 219 and filled with a conductive material such as tungsten (W), copper (Cu) or the like, and metal contacts are formed on top of the dielectric material 219. As shown, vias 226 and 227 electrically coupled the doped regions 223 and 225, respectively to metal contacts 230 and 231, via 228 electrically couples the source metal 220 to the metal contact 232, and via 229 electrically couples the drain metal 221 to metal contact 233. Although not shown, it should be appreciated that additional metal layers can be formed in a similar manner as that disclosed in the first embodiment, and, in particular, in FIG. 3G.

Figure 6:
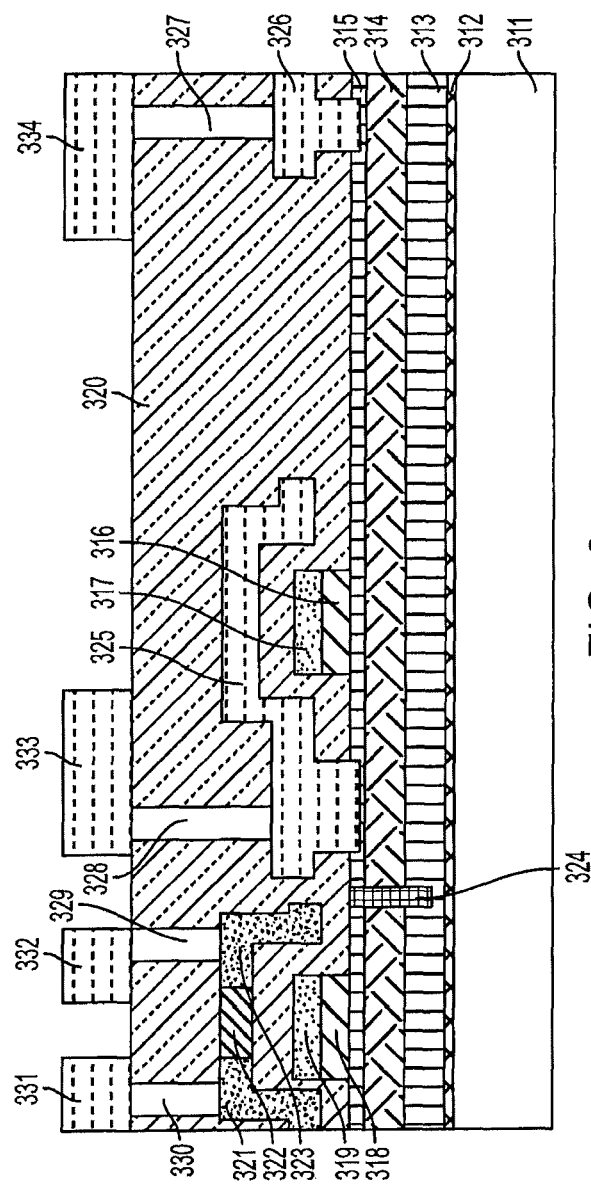
FIG. 6 illustrates yet another embodiment of a GaN integrated circuit according to the present invention.

FIG. 6 illustrates yet another embodiment of a GaN integrated circuit according to an exemplary embodiment of the present invention. The circuit illustrated in FIG. 6 is similar design to the GaN integrated circuit having a bottom gate polysilicon device structure as illustrated in FIG. 4A. FIG. 6 differs in that the bottom gate is formed using the pGaN layer and gate metal as the gate layer for the polysilicon FET, which effectively reduces the number of masks during fabrication as will become apparent from the exemplary process described below with respect to FIGS. 7A-7H.

As shown in FIG. 6, the GaN is formed on a substrate 311, one or more transistor layers 312 (e.g., an AN seed layer), a buffer layer 313 (e.g., an AlGaN layer), a channel layer 314 and an AlGaN barrier layer 315. Moreover, a pGaN layer 316 and gate metal 317 are formed on the barrier layer 315. An additional region of the pGaN layer 318 and gate metal 319 is formed on the barrier in the region isolated by isolation region 324. The pGaN layer 318 and gate metal 319 form the gate layer for the polysilicon FET.

Moreover, source and drain metals 325 and 326 are formed on the barrier layer 315 with vias 328 and 327 electrically connecting the source and drain metals 325 and 326 to metal contacts 333 and 334, respectively. As noted above, an isolation region 324 is formed by ion implantation or etching in the buffer barrier layer 315, the channel layer 314 and extending into the buffer layer 313. The device further includes an insulating material 320 that electrically insulates and protects the device metals. Furthermore, a polysilicon layer is formed above the bottom gate 318, 319. In particular, the polysilicon layer can comprise an n-type region 321, a p-type region 322 and an n-type region 323 (i.e., an NPN layer for the source, channel and drain of the device), although it should be appreciated that the regions can be reversed to form a PNP layer. Vias 330 and 329 couple the doped regions 321 and 323, respectively to metal contacts 331 and 333. Accordingly, like the exemplary device of FIG. 4A, the device shown in FIG. 6 includes a bottom gate structure for a polysilicon FET that is disposed in an area of the circuit isolated from the active cells of the GaN FET. Although not shown, it should also be appreciate that the same structure can be formed with the gate structure for the polysilicon FET in the active region of the circuit (similar to the embodiment of FIG. 4B), rather than in the isolated region as it is disposed in the device shown in FIG. 6.

FIGS. 7A-7H illustrate an exemplary manufacturing process using a polysilicon layer to fabricate the device in an GaN integrated circuit as shown in FIG. 6. All process flows can be used to form bottom gate polysilicon FETs in both the isolation area (FIG. 6) or the active region (not shown). A back gate formed by the polysilicon/gate metal prevents the effect of the 2DEG potential on the polysilicon FET.

Figure 7A:
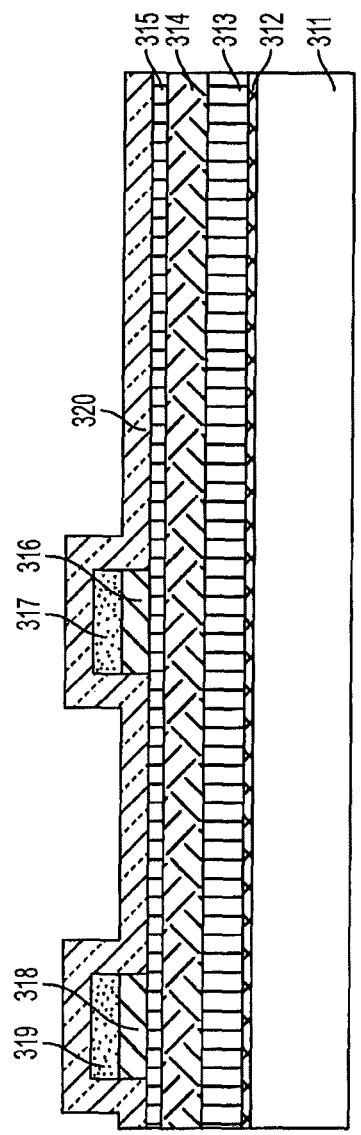
FIGS. 7A-7H illustrate an exemplary manufacturing process using a polysilicon layer to fabricate the device in an GaN integrated circuit as shown in FIG. 6.

FIG. 7A illustrates an EPI structure, including, from bottom to top, silicon substrate 311, transition layers 312, a GaN buffer material 313, a channel layer 314, and an AlGaN barrier material 315. Furthermore, a p-type GaN material 316, 317 is formed on the barrier material 315 and a gate metal 317, 319 is formed (i.e., deposited or grown) on the p-type GaN material 316. Although not shown, these structures are formed by depositing a photoresist and etching the gate metal 317, 319 and the p-type GaN material 316, 318 using any known technique, e.g., plasma etching. After these structures are formed, an insulating layer 320 is deposited.

Figure 7B:
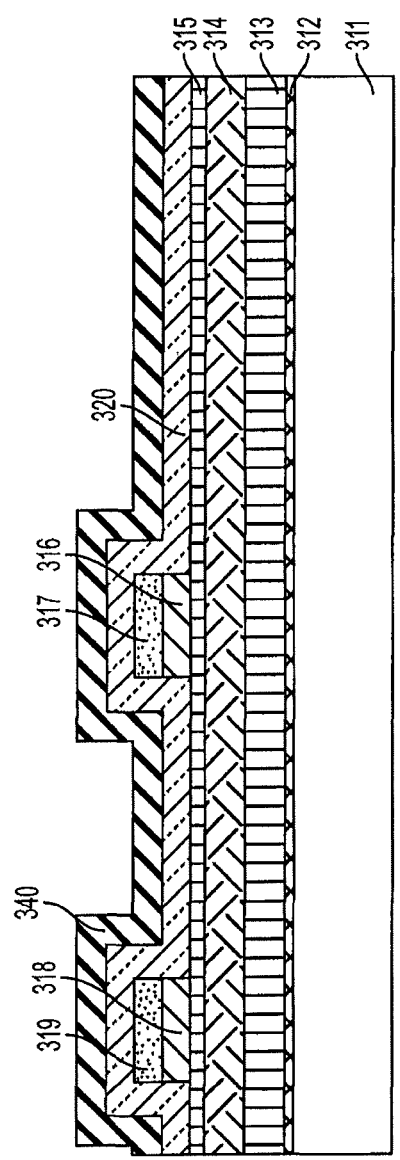
Figure 7C:
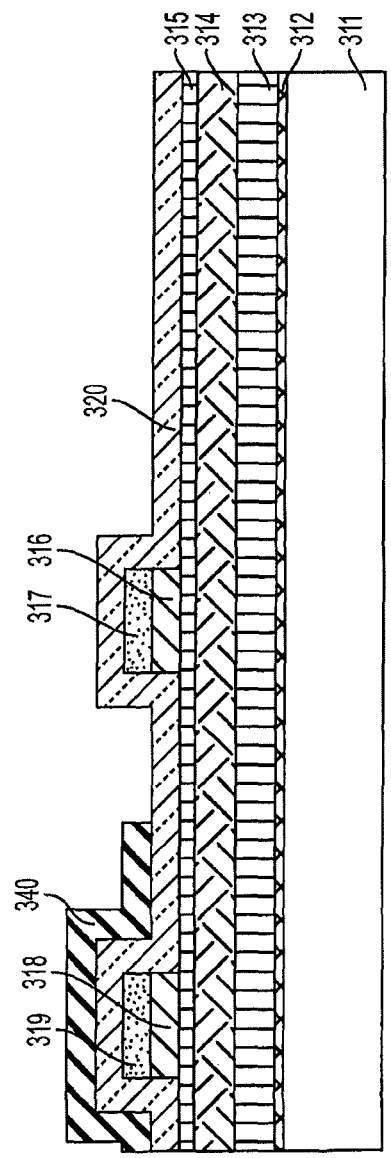
Figure 7D:
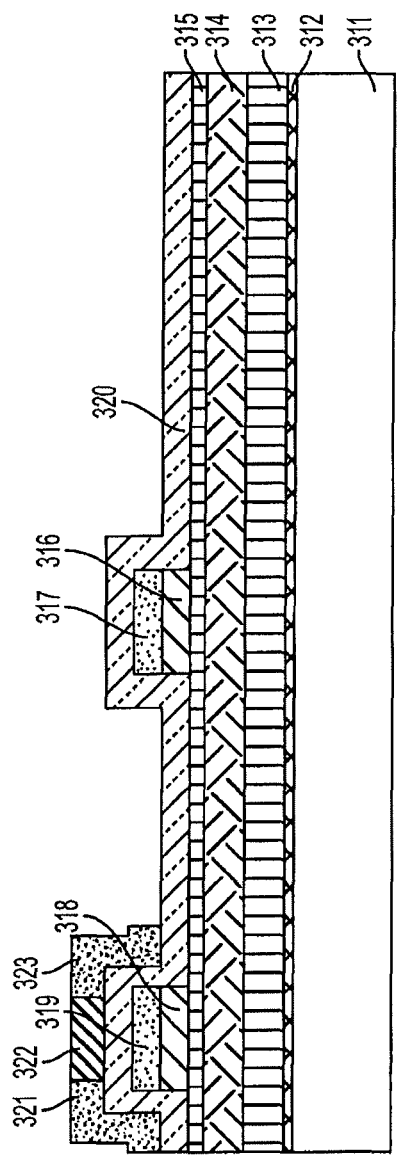

Next as shown in FIG. 7B, a polysilicon layer 340 is deposited on the insulating layer 320, which is then etched as shown in FIG. 7C. Next, as illustrated in FIG. 7D, a step of masking and ion implanting the remaining polysilicon layer 340 is performed to form NPN or PNP layers. As noted above, ion implanting of the polysilicon layer can result in an n-type region 321, a p-type region 322 and an n-type region 323 (i.e., an NPN layer for the source, channel and drain of the device) or, alternatively, a PNP layer.

Figure 7E:
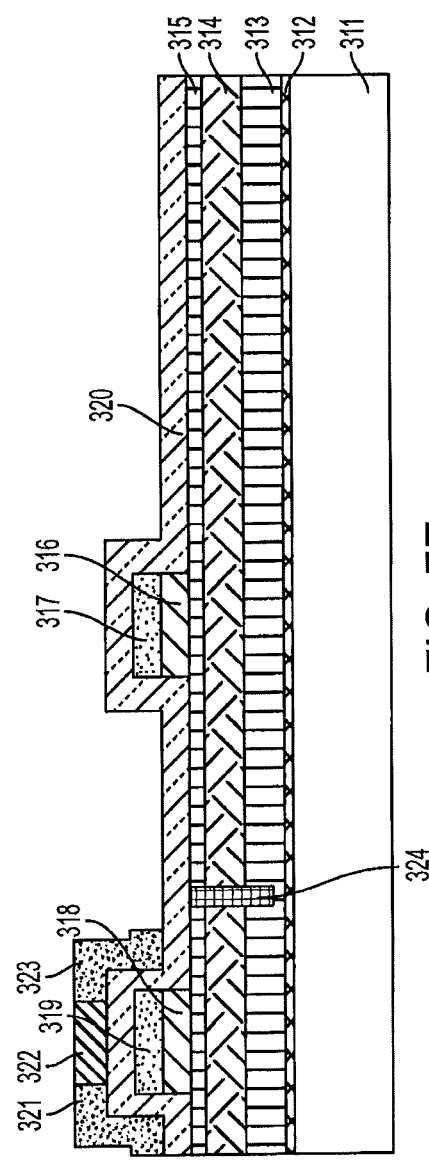

As shown in FIG. 7E, an isolation region 324 is then formed by covering the portion of device layer and then etching down the exposed layers, at least below the channel layer 314. The etched region can then be filled with oxide or other suitable isolating materials. It should be appreciated that isolation region 324 can be formed using any other techniques as would be understood to one skilled in the art and further that isolation region 324 can be formed at different stages in the process, for example, before the insulating layer 320 is deposited in step 7A.

Figure 7F:
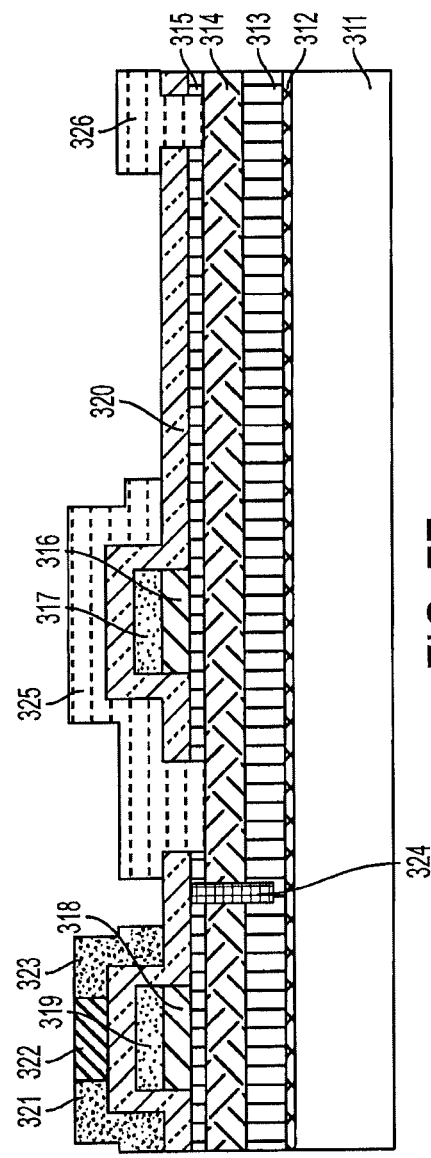
Figure 7G:
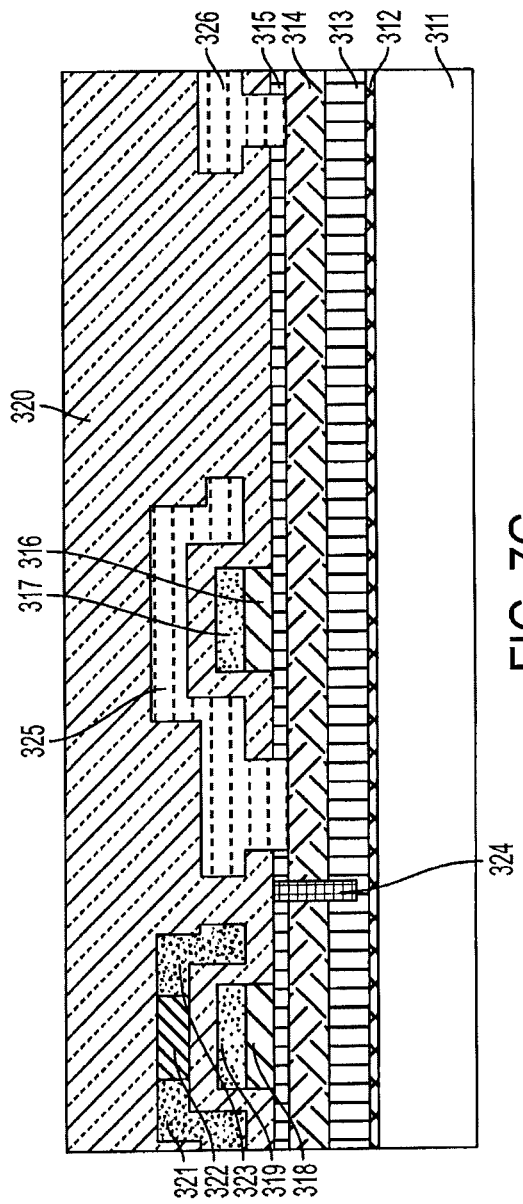
Figure 7H:
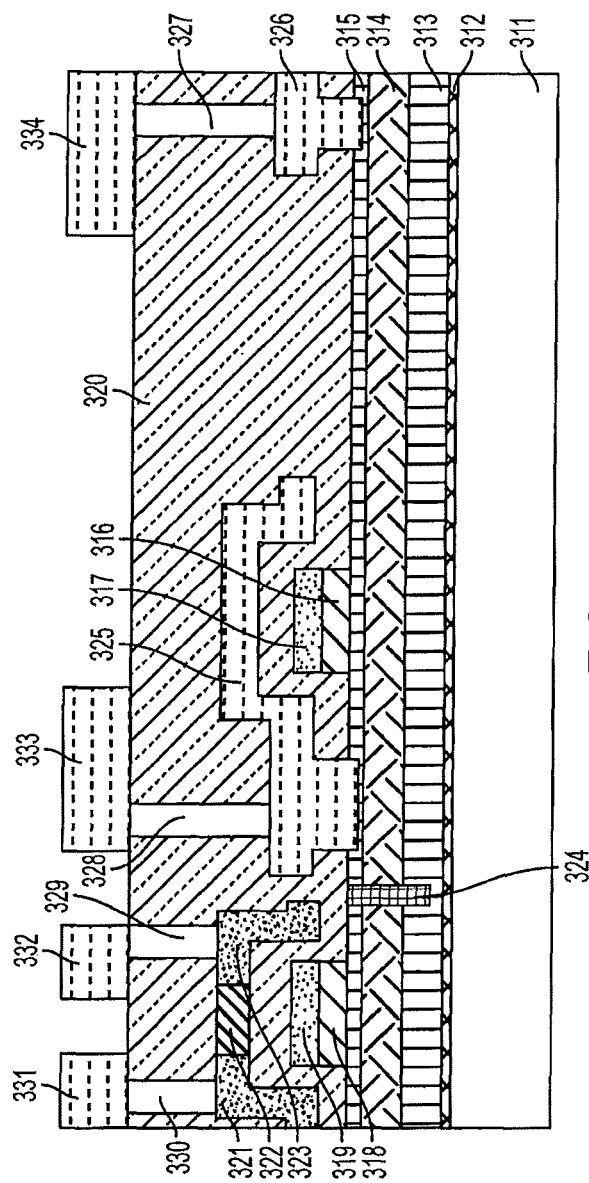

Next, as shown in FIG. 7F, the insulating material 320 is etched using a contact photo mask to form contact openings and contact metals are deposited to faun the source metal 325, drain metal 326, and optionally a field plate. An additional insulating layer 320 is deposited (FIG. 7G) before a plurality of vias are formed in the dielectric material 320 and filled with a conductive material such as tungsten (W), copper (Cu) or the like, and metal contacts are formed on top of the dielectric material 320. As shown in FIG. 7H, vias 330 and 329 electrically coupled the doped regions 321 and 323, respectively to metal contacts 331 and 332, via 328 electrically couples the source metal 325 to the metal contact 333, and via 327 electrically couples the drain metal 326 to metal contact 334. Although not shown, it should be appreciated that additional metal layers can be formed in a similar manner as that disclosed in the first embodiment, and, in particular, in FIG. 3G.

Figure 8:
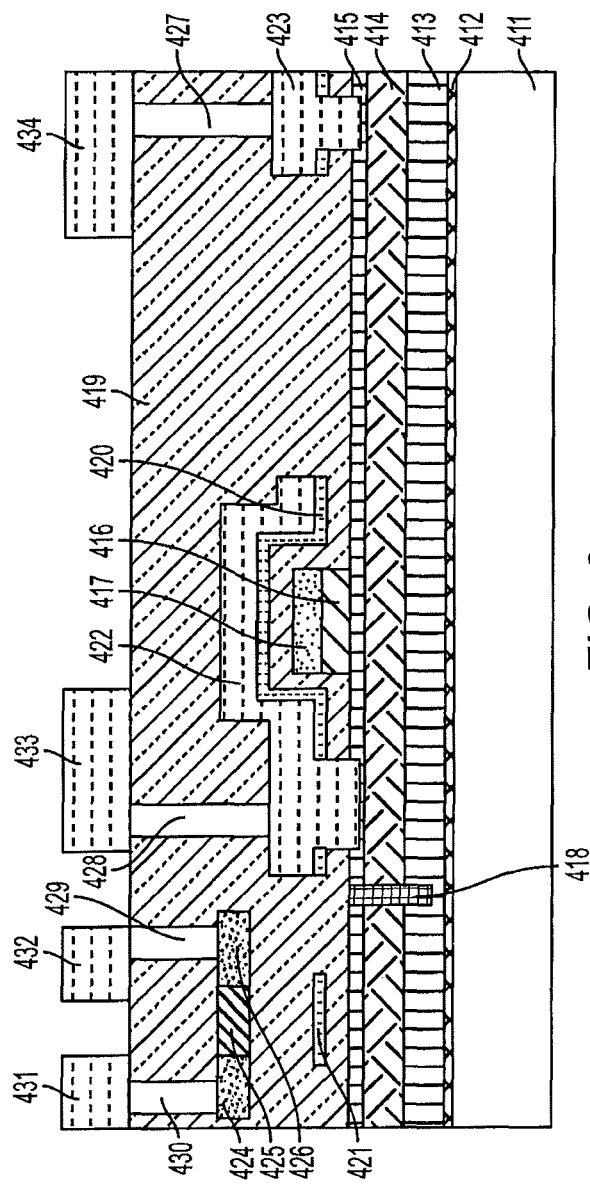
FIG. 8 illustrates yet another variation of a GaN integrated circuit according to an exemplary embodiment of the present invention.

FIG. 8 illustrates yet another variation of a GaN integrated circuit according to an exemplary embodiment of the present invention. The circuit illustrated in FIG. 8 is a similar design to the GaN integrated circuit having a bottom gate polysilicon device structure as illustrated in FIG. 4A. FIG. 8 differs in that a metal layer that is normally used as a barrier layer for Metal 1 is used as the bottom gate for the polysilicon FET, which effectively reduces the number of masks during fabrication as will become apparent from the exemplary process described below with respect to FIGS. 9A-9I.

As shown in FIG. 8, a GaN integrated circuit is provided that includes a bottom gate polysilicon device structure and is formed on a substrate 411, one or more transistor layers 412 (e.g., an AN seed layer), a buffer layer 413 (e.g., an AlGaN layer), a channel layer 414 and an AlGaN barrier layer 415. These layers are similar to those of the EPI structure described above with reference to the embodiments discussed above.

As further shown, a pGaN layer 416 and gate metal 417 are formed on the barrier layer 415. Source and drain metals 422 and 423 are formed on the barrier layer 415 with vias 428 and 427 electrically connecting the source and drain metals 422 and 423 to metal contacts 433 and 434, respectively. Furthermore, an isolation region 418 is formed by ion implantation or etching in the buffer barrier layer 415, the channel layer 414 and extending into the buffer layer 413. The device further includes an insulating material 419 that electrically insulates and protects the device metals. As shown, a bottom gate 421 of the polysilicon FET is formed in the insulating material. It is noted that the bottom gate 421 can be a metal, polysilicon or other conductive material. Moreover, in this embodiment, the metal layer extends under the source and drain metals 422 and 423 and is denoted as 420. The device in FIG. 8 further includes a polysilicon layer that is formed above the bottom gate 421. The polysilicon layer can comprise an n-type region 424, a p-type region 425 and an n-type region 426 (i.e., an NPN layer for the source, channel and drain of the device), although it should be appreciated that the regions can be reversed to form a PNP layer. Vias 430 and 429 couple the doped regions 424 and 426, respectively to metal contacts 431 and 432. Accordingly, the device shown in FIG. 8 includes a bottom gate structure for a polysilicon FET that is disposed in an area of the circuit isolated from the active cells of the GaN FET. Alternatively, the bottom gate of the polysilicon FET 421 can be formed in the active region of the circuit rather than the isolated region as it is disposed in the device shown in FIG. 8.

FIGS. 9A-9I illustrate an exemplary manufacturing process using a polysilicon layer to fabricate the devices in an GaN integrated circuit as shown in FIG. 8. All process flows can be used to form bottom gate polysilicon FETs in both the active device area (not shown) or in the isolation area (FIG. 8). A back gate formed by the polysilicon/gate metal prevents the effect of the 2DEG potential on the polysilicon FET.

Figure 9A:
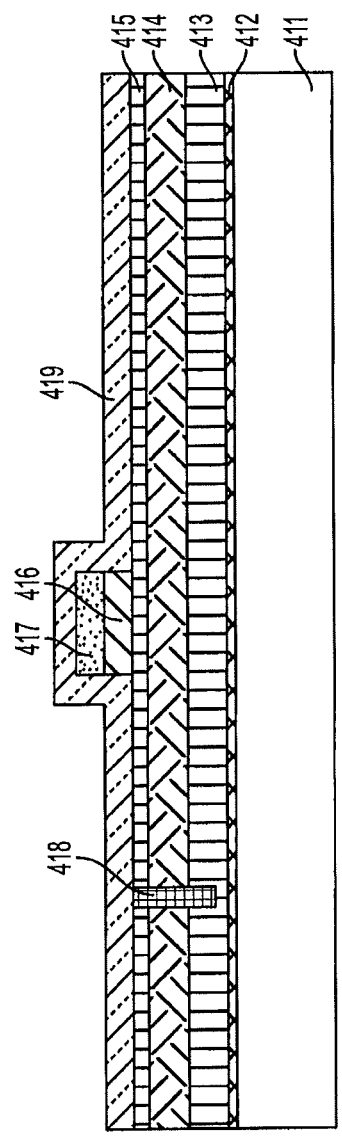

Initially, as shown in FIG. 9A, an EPI structure is formed that includes, from bottom to top, silicon substrate 411, transition layers 412, a GaN buffer material 413, a channel layer 414, and an AlGaN barrier material 415. Furthermore, a p-type GaN material 416 is formed on the barrier material 415 and a gate metal 417 is formed (i.e., deposited or grown) on the p-type GaN material 416. After a photoresist is deposited and the gate metal 417 and the p-type GaN material 416 are etched, an isolation region 418 is then formed and an insulating material 419 is deposited over the EPI structure. Isolation region 418 can be formed by covering the portion of device layer 415 and then etching down the exposed layers, at least below the channel layer 414. The etched region can then be filled with oxide or other suitable isolating materials.

Figure 9C:
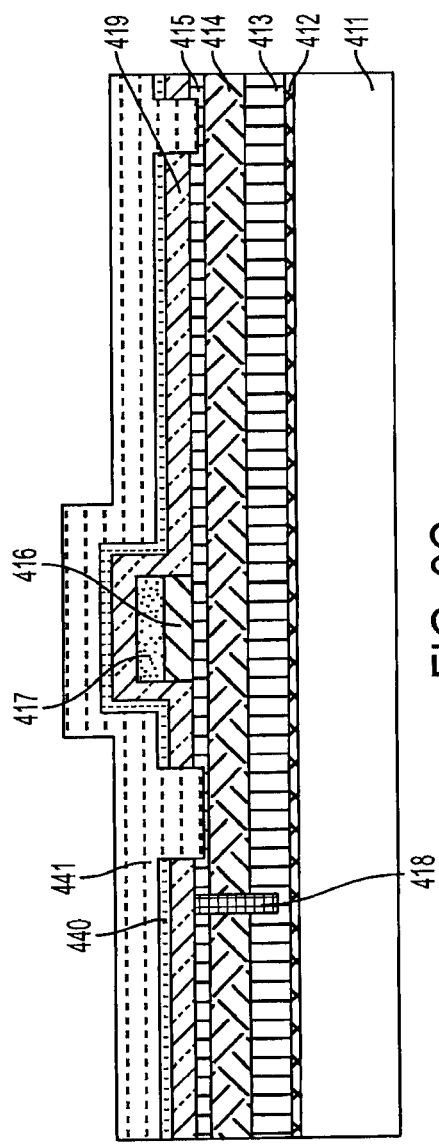
Figure 9D:
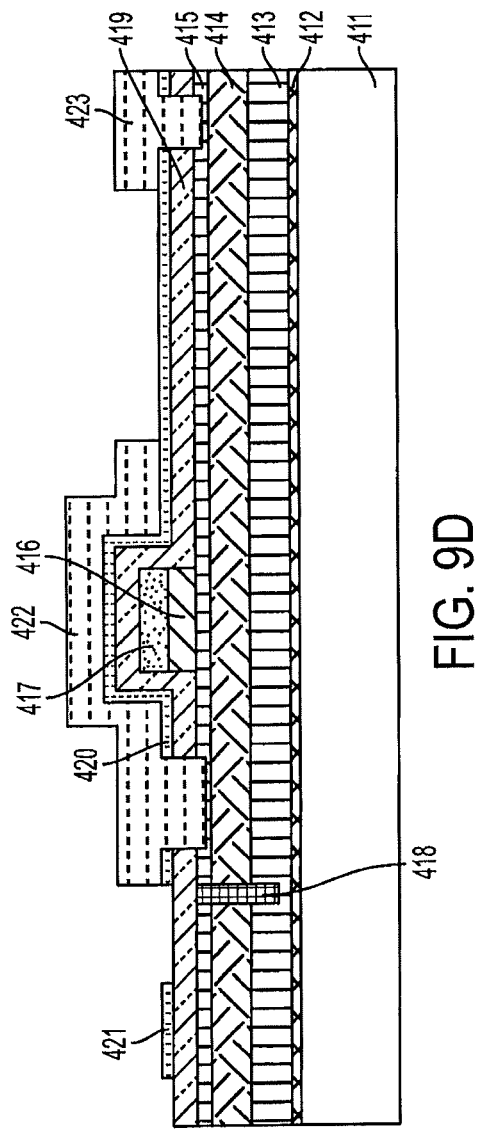

Next, a barrier metal 440 under Metal 1 is deposited as shown in FIG. 9B. FIG. 9C illustrates the next step in which the barrier metal 440 and the insulating material 419 are etched to form contact openings and a contact metal (i.e., Metal 1) 441 is deposited to form the source metal, drain metal, and optionally a field plate. As further shown in FIG. 9D, the metal layer 441 and barrier metal 440 are etched for form the source metal 422, drain metal 423 and barrier metal layer 421 for the polysilicon FET. It should be appreciated in the exemplary embodiment, the metal layer is etched over the barrier metal layer 421, but is not etched where the source metal 422 and drain metal 423 are to be formed. In other words, the manufacturing processes must selectively determine which metal layers are to be etched.

Figure 9E:
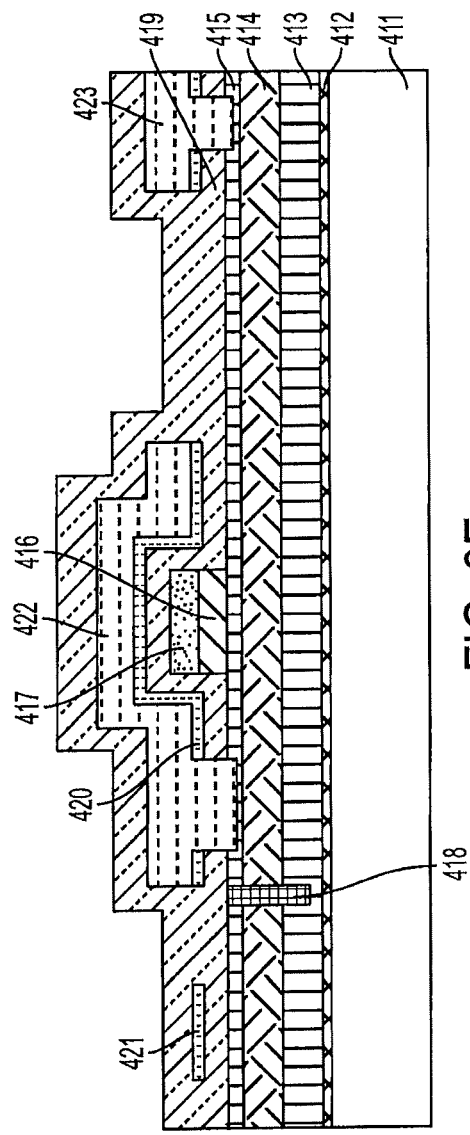
Figure 9F:
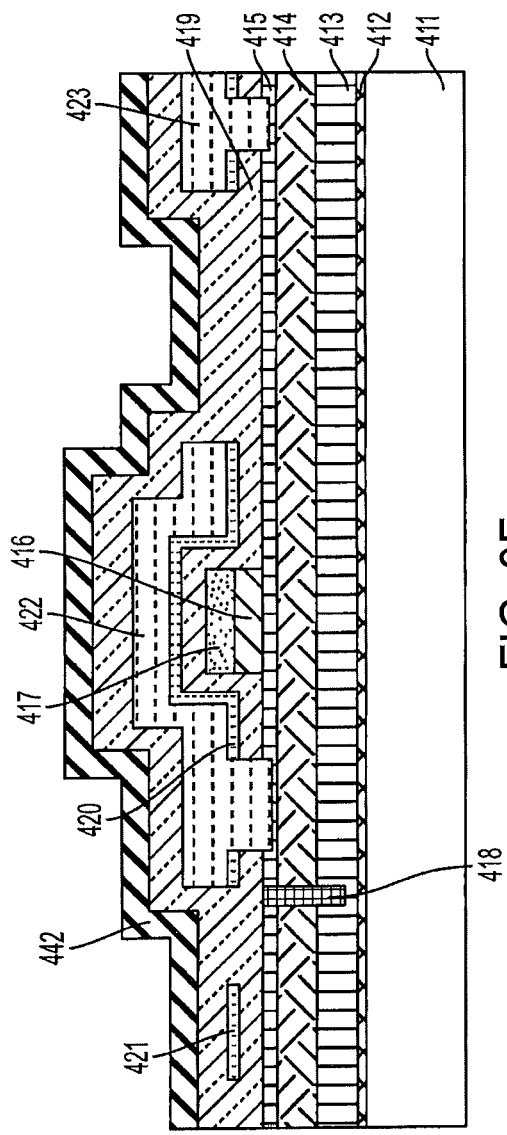
Figure 9G:
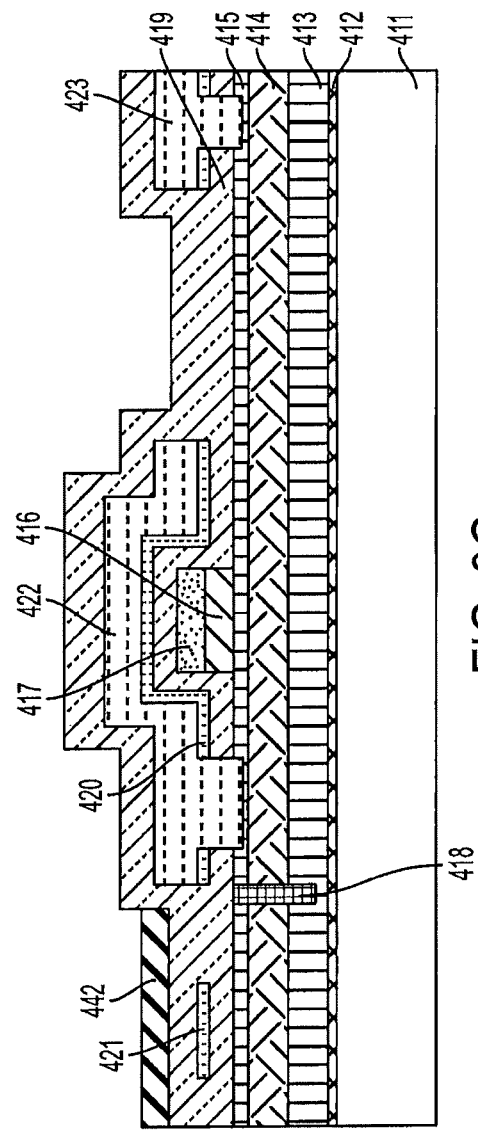
Figure 9H:
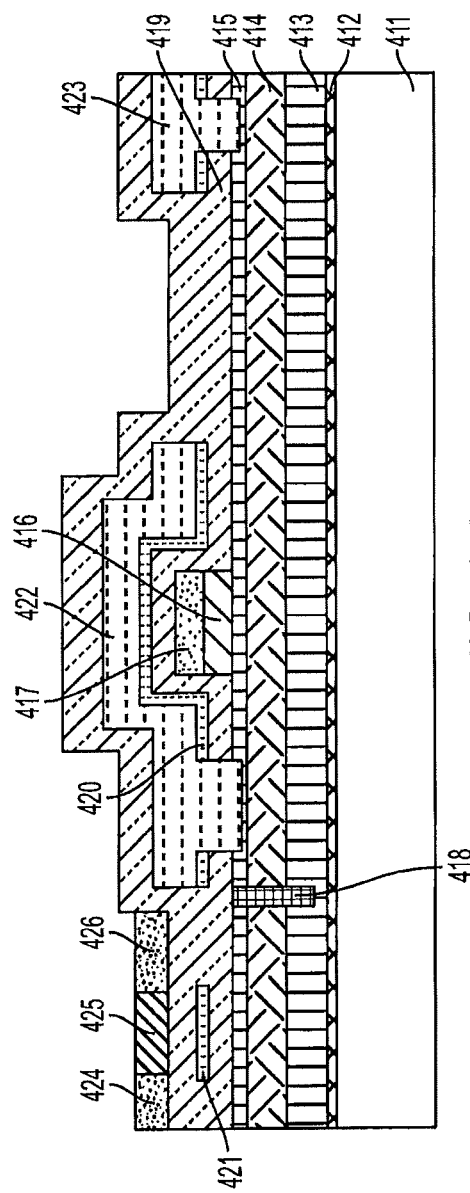

As before, an insulating material is then deposited on the structure, which is again shown as insulating material 419 in FIG. 9E, and a polysilicon layer 442 is deposited on the insulating material 419 as shown in FIG. 9F. The polysilicon layer 442 is then etched using a contact photo mask such that the remaining portion of the layer is formed over the gate metal 421 as shown in FIG. 9G. Then, in step FIG. 9H, a step of masking and ion implanting the polysilicon layer 442 is performed to form NPN or PNP layers. As noted above, ion implanting of the polysilicon layer can result in an n-type region 424, a p-type region 425 and an n-type region 426 (i.e., an NPN layer for the source, channel and drain of the device) or, alternatively, a PNP layer.

Figure 9I:
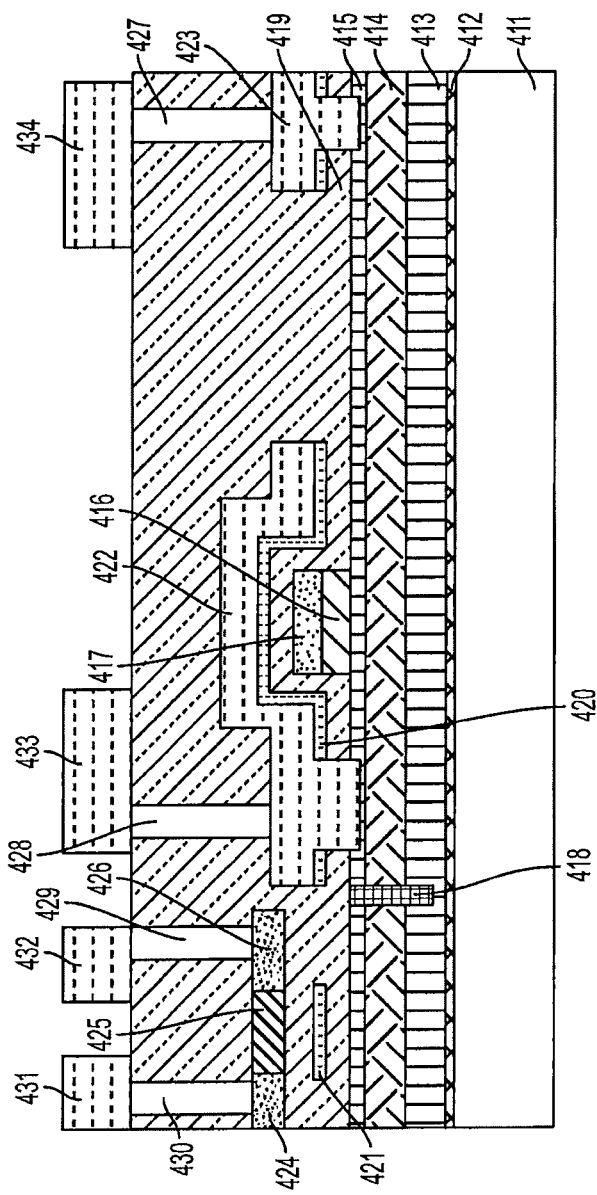

Finally, as shown in FIG. 9I, an additional dielectric material is deposited (again shown as dielectric material 419), a plurality of vias are formed in the dielectric material 419 and filled with a conductive material such as tungsten (W), copper (Cu) or the like, and metal contacts are formed on top of the dielectric material 219. As shown, vias 430 and 429 electrically coupled the doped regions 424 and 426, respectively to metal contacts 431 and 432, via 428 electrically couples the source metal 422 to the metal contact 433, and via 427 electrically couples the drain metal 423 to metal contact 434. Although not shown, it should be appreciated that additional metal layers can be formed in a similar manner as that disclosed in the first embodiment, and, in particular, in FIG. 3G.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A method of manufacturing an integrated circuit, the method comprising:
    depositing a channel layer over at least one buffer layer;
    depositing a barrier layer over the channel layer, such that a two dimensional electron gas (2DEG) region is formed at an interface between the channel layer and the barrier layer;
    forming an isolation region in the barrier layer and the channel layer to electrically isolate a first portion of the 2DEG region from a second portion of the 2DEG region;
    forming a gate structure for an enhancement mode device over the first portion of the 2DEG region;
    depositing a first insulating layer over the gate structure;

forming a back gate over the second portion of the 2DEG region;

depositing a second insulating layer over the back gate;

depositing a polysilicon layer on the second insulating layer and etching the polysilicon layer, such that at least a portion of the etched polysilicon layer is disposed over the back gate;

doping the etched polysilicon layer to form at least one p-type region in the polysilicon layer;

depositing a third insulating layer on the etched polysilicon layer; and forming at least one metal interconnect layer on the third insulating layer that is electrically coupled to the at least one p-type region of the polysilicon layer by at least one via formed in the third insulating layer.

2. The method according to claim 1, wherein the step of forming the back gate over the second portion of the 2DEG region comprises depositing a gate metal on the first insulating layer and etching the gate metal, such that the etched gate metal is disposed over the second portion of the 2DEG region.

3. The method according to claim 2, wherein the step of etching the gate metal comprises etching the gate metal and the first insulating layer to form a pair of contact windows extending to the barrier layer on opposite sides of the gate structure.

4. The method according to claim 3, further comprising forming a source metal and a drain metal in the pair of contact windows, respectively, wherein at least a portion of the source metal and a portion of the drain metal are each disposed over the gate metal.

5. The method according to claim 4, wherein the step of depositing the second insulating layer further comprises depositing the second insulating layer on the source metal and the drain metal.

6. The method according to claim 1, wherein the steps of forming the gate structure over the first portion of the 2DEG region and forming the back gate over the second portion of the 2DEG region comprises:

depositing a p-type GaN layer over the barrier layer;

depositing a gate metal on the p-type GaN layer;

forming a patterned photoresist on a first portion of the gate metal disposed over the first portion of the 2DEG region and on a second portion of the gate metal disposed over the second portion of the 2DEG region; and etching the gate metal and the p-type GaN layer.

7. The method according to claim 1, wherein the step, of forming the isolation region comprises one of ion implantation in or etching of the barrier layer and the channel layer.

8. The method according to claim 1, wherein the step of doping the polysilicon layer further comprises doping the polysilicon layer to form at least one n-type region in the polysilicon layer.

9. The method according to claim 8, wherein the step of doping the polysilicon layer further comprises forming either a second n-type region or a second p-type region, such that the doped polysilicon layer comprises either a PNP layer or an NPN layer as a source, a gate and a drain of an FET device.

10. An integrated circuit comprising:

a channel layer disposed over at least one buffer layer;

a barrier layer disposed over the channel layer, with a two dimensional electron gas (2DEG) region formed at an interface between the channel layer and the barrier layer;

an isolation region disposed in the barrier layer and the channel layer to electrically isolate a first portion of the 2DEG region from a second portion of the 2DEG region;

a gate structure for an enhancement mode device disposed over the first portion of the 2DEG region;

a first insulating layer disposed over the gate structure;

a back gate disposed over the second portion of the 2DEG region;

a second insulating layer disposed over the back gate;

a polysilicon layer disposed on the second insulating layer and over the back gate, the polysilicon layer including at least one p-type region;

a third insulating layer disposed on the etched polysilicon layer; and at least one metal interconnect layer disposed on the third insulating layer that is electrically coupled to the at least one p-type region of the polysilicon layer by at least one via formed in the third insulating layer.

11. The integrated circuit according to claim 10, wherein the back gate over the second portion of the 2DEG region is disposed on the first insulating layer.

12. The integrated circuit according to claim 11, further comprising a pair of contact windows extending through the gate metal and the first insulating layer to the barrier layer on opposite sides of the gate structure.

13. The integrated circuit according to claim 12, further comprising a source metal and a drain metal disposed in the pair of contact windows, respectively, wherein at least a portion of the source metal and a portion of the drain metal are each disposed over the gate metal.

14. The integrated circuit according to claim 13, wherein the second insulating layer is disposed on the source metal and the drain metal.

15. The integrated circuit according to claim 11, wherein the gate structure and the back gate each comprise a p-type GaN layer disposed over the barrier layer and a gate metal disposed on the p-type GaN layer.

16. The integrated circuit according to claim 10, wherein the polysilicon layer further comprises at least one n-type region.

17. The integrated circuit according to claim 16, wherein the polysilicon layer further comprises either a second n-type region or a second p-type region, such that the doped polysilicon layer comprises either a PNP layer or an NPN layer as a source, a gate and a drain of an FET device.

* * * * *